(12) United States Patent
Ang et al.

(10) Patent No.: US 12,168,603 B2
(45) Date of Patent: *Dec. 17, 2024

(54) MONOLITHIC POST COMPLEMENTARY METAL-OXIDE-SEMICONDUCTOR INTEGRATION OF THERMOELECTRIC-BASED INFRARED DETECTOR

(71) Applicant: Meridian Innovation Pte Ltd, Singapore (SG)

(72) Inventors: Wan Chia Ang, Singapore (SG); Piotr Kropelnicki, Singapore (SG); Ilker Ender Ocak, Singapore (SG)

(73) Assignee: Meridian Innovation Pte Ltd, Singapore (SG)

( * ) Notice: Subject to any disclaimer, the term of this patent is extended or adjusted under 35 U.S.C. 154(b) by 585 days.

This patent is subject to a terminal disclaimer.

(21) Appl. No.: 17/440,784

(22) PCT Filed: Apr. 1, 2020

(86) PCT No.: PCT/SG2020/050201
§ 371 (c)(1),
(2) Date: Sep. 19, 2021

(87) PCT Pub. No.: WO2020/204833
PCT Pub. Date: Oct. 8, 2020

(65) Prior Publication Data
US 2022/0185660 A1      Jun. 16, 2022

Related U.S. Application Data

(63) Continuation-in-part of application No. 17/156,639, filed on Jan. 25, 2021.
(Continued)

(51) Int. Cl.
*B81C 1/00* (2006.01)
*B81B 7/00* (2006.01)
(Continued)

(52) U.S. Cl.
CPC .......... *B81C 1/00246* (2013.01); *G01J 5/024* (2013.01); *G01J 5/12* (2013.01); *B81B 7/0006* (2013.01);
(Continued)

(58) Field of Classification Search
None
See application file for complete search history.

(56) References Cited

U.S. PATENT DOCUMENTS

| | | | |
|---|---|---|---|
| 6,335,478 B1 | 1/2002 | Chou et al. | |
| 6,803,250 B1 | 10/2004 | Yaung et al. | |

(Continued)

FOREIGN PATENT DOCUMENTS

| | | |
|---|---|---|
| CN | 102935994 A | 2/2013 |
| CN | 104501970 A | 4/2015 |

(Continued)

OTHER PUBLICATIONS

J. H. Smith et al., Embedded Micromechanical Devices for the Monolithic Integration of MEMS with CMOS, IEEE International Electron Devices Meeting, Dec. 10-13, 1995, pp. 1-5, Sandia National Labs., Albuquerque, New Mexico, U.S.A.

(Continued)

*Primary Examiner* — Michael Lebentritt
(74) *Attorney, Agent, or Firm* — HORIZON IP PTE LTD.

(57) ABSTRACT

A complementary metal oxide semiconductor (CMOS) device embedded with micro-electro-mechanical system (MEMS) components in a MEMS region is disclosed. The MEMS components, for example, are infrared (IR) thermosensors. The MEMS sensors are integrated on the CMOS (Continued)

device monolithically after CMOS processing. For example, the MEMS sensors are formed over a BEOL dielectric of a CMOS device. The device is encapsulated with a CMOS compatible IR transparent cap to hermetically seal the MEMS sensors in the MEMS region.

20 Claims, 23 Drawing Sheets

Related U.S. Application Data

(60) Provisional application No. 62/827,205, filed on Apr. 1, 2019.

(51) Int. Cl.
*G01J 5/02* (2022.01)
*G01J 5/12* (2006.01)

(52) U.S. Cl.
CPC ............ *B81B 2201/0207* (2013.01); *B81C 2203/0714* (2013.01); *B81C 2203/0742* (2013.01); *G01J 2005/123* (2013.01)

(56) References Cited

U.S. PATENT DOCUMENTS

| | | | |
|---|---|---|---|
| 7,755,048 B2 | 7/2010 | Hsu | |
| 9,324,760 B2 | 4/2016 | Vasseur et al. | |
| 9,505,611 B1 | 11/2016 | Liu et al. | |
| 9,577,001 B2 | 2/2017 | Enichlmair et al. | |
| 9,640,531 B1* | 5/2017 | Or-Bach | H01L 27/1203 |
| 10,522,499 B2* | 12/2019 | Enquist | H01L 24/05 |
| 11,923,374 B2* | 3/2024 | Or-Bach | H01L 21/84 |
| 11,932,534 B2* | 3/2024 | Lin | B81C 1/00238 |
| 2004/0245586 A1 | 12/2004 | Partridge et al. | |
| 2007/0057343 A1 | 3/2007 | Chinthakindi et al. | |
| 2008/0142912 A1 | 6/2008 | Inaba et al. | |
| 2008/0216883 A1 | 9/2008 | Leneke et al. | |
| 2009/0243004 A1 | 10/2009 | Lan et al. | |
| 2010/0031992 A1 | 2/2010 | Hsu | |
| 2010/0181484 A1 | 7/2010 | Inada et al. | |
| 2010/0243892 A1 | 9/2010 | Dupont | |
| 2011/0147869 A1 | 6/2011 | Lazarov et al. | |
| 2012/0061569 A1 | 3/2012 | Noguchi | |
| 2012/0097415 A1 | 4/2012 | Reinert et al. | |
| 2013/0234270 A1 | 9/2013 | Yama et al. | |
| 2013/0285165 A1 | 10/2013 | Classen et al. | |
| 2015/0076651 A1 | 3/2015 | Noguchi | |
| 2015/0123221 A1 | 5/2015 | Reinmuth et al. | |
| 2015/0168221 A1 | 6/2015 | Mao et al. | |
| 2015/0177069 A1 | 6/2015 | Maes et al. | |
| 2015/0210540 A1 | 7/2015 | Sadaka et al. | |
| 2015/0243823 A1 | 8/2015 | Herrmann et al. | |
| 2015/0321905 A1 | 11/2015 | Gooch et al. | |
| 2015/0360939 A1* | 12/2015 | Zhang | B81C 1/0023 438/455 |
| 2016/0079306 A1 | 3/2016 | Kropelnicki et al. | |
| 2016/0214855 A1 | 7/2016 | Yeh et al. | |
| 2016/0264402 A1 | 9/2016 | Yu et al. | |
| 2016/0289063 A1 | 10/2016 | Ocak et al. | |
| 2016/0318758 A1 | 11/2016 | Chou et al. | |
| 2016/0332867 A1 | 11/2016 | Tseng et al. | |
| 2016/0379961 A1 | 12/2016 | Lee et al. | |
| 2017/0107097 A1 | 4/2017 | Cheng et al. | |
| 2017/0179119 A1 | 6/2017 | Chang et al. | |
| 2017/0203956 A1 | 7/2017 | Breitling et al. | |
| 2017/0207214 A1* | 7/2017 | Or-Bach | H01L 21/6835 |
| 2018/0257927 A1 | 9/2018 | Rothberg et al. | |
| 2019/0019838 A1 | 1/2019 | Kropelnicki et al. | |
| 2019/0027522 A1 | 1/2019 | Kropelnicki et al. | |
| 2019/0293692 A1* | 9/2019 | Clarke | H01L 23/62 |
| 2022/0128411 A1* | 4/2022 | Ocak | B81B 7/0006 |

FOREIGN PATENT DOCUMENTS

| | | | |
|---|---|---|---|
| CN | 105679927 A | 6/2016 | |
| CN | 106252323 A | 12/2016 | |
| CN | 106601697 A | 4/2017 | |
| CN | 106744656 A | 5/2017 | |
| EP | 2105963 A2 | 9/2009 | |
| EP | 2264765 A1 | 12/2010 | |
| EP | 2848586 A1 * | 3/2015 | ......... B81C 1/00269 |
| TW | 201339544 A | 10/2013 | |
| TW | 201725168 A * | 7/2017 | ........... B81B 3/0081 |
| WO | 2014100706 A1 | 6/2014 | |

OTHER PUBLICATIONS

A Graf et al, Review of micromachined thermopiles for infrared detection, Measurement Science and Technology, Jul. 1, 2007, pp. R59-R75, vol. 18, No. 7, IOP Publishing, Bristol, GB.

\* cited by examiner

MONOLITHIC POST COMPLEMENTARY METAL-OXIDE-SEMICONDUCTOR INTEGRATION OF THERMOELECTRIC-BASED INFRARED DETECTOR

CROSS-REFERENCE TO RELATED APPLICATIONS

This application claims the benefit of U.S. Provisional Application No. 62/827,205 filed on Apr. 1, 2019. This application cross-references to U.S. patent application Ser. No. 16/809,561, filed on Mar. 5, 2020 which is a continuation-in-part application of co-pending U.S. patent application Ser. No. 16/517,653, filed on Jul. 21, 2019 which is a continuation application of U.S. patent application Ser. No. 15/647,284, titled Scalable Thermoelectric-based Infrared Detector, now U.S. Pat. No. 10,403,674, filed on Jul. 12, 2017. This application cross-references to U.S. patent application Ser. No. 16/224,782, filed on Dec. 18, 2018, which is a divisional application of U.S. patent application Ser. No. 15/653,558, titled Thermoelectric-based Infrared Detector with high CMOS Integration, now U.S. Pat. No. 10,199,424, filed on Jul. 19, 2017. This application further cross-references to same day filed PCT International Application titled Heterogenous Integration of Complementary Metal-oxide Semiconductor and MEMS sensors, filed on Apr. 1, 2020, which claims the benefit of U.S. Provisional Application No. 62/827,207 filed on Apr. 1, 2019. This application further cross-references to U.S. Provisional Application No. 62/827,861, filed on Apr. 2, 2019. The disclosure of all of which is herein incorporated by reference in their entireties for all purposes.

BACKGROUND

The demand for uncooled infrared (IR) detectors is continually growing due to the increased demand from numerous applications. These applications, just to name a few, include air conditioning systems, handphones, autonomous driving cars, internet of things (IoT), fire-fighting and traffic safety. Furthermore, it is expected that there will be numerous more applications in the near future for uncooled IR detectors.

Micro-electro-mechanical system (MEMS) IR detectors have been proposed. In addition, it is desirable to embed MEMS IR detectors with complementary metal oxide semiconductor (CMOS) integrated circuits due to compactness and cost-effectiveness of the resulting system. However, embedding MEMS IR detectors with ICs poses significant challenges due to the limited thermal budget available for post CMOS processes.

The present disclosure is directed to cost-effective and compact embedded with IR detectors.

SUMMARY

Embodiments of the present disclosure generally relate to devices and methods of forming such devices. In particular, embodiments relate to CMOS devices embedded with MEMS components or sensors. The MEMS components, for example, may be IR sensors.

In one embodiment, a method for forming a device includes providing a substrate prepared with a complementary metal oxide semiconductor (CMOS) region with CMOS components and a BE dielectric with interconnections for interconnecting the CMOS components. The method further includes forming a MEMS level on the BE dielectric, the MEMS level includes a MEMS region with a MEMS component and the MEMS component includes recrystallized polysilicon structures. The MEMS level occupies a portion of the BE dielectric. The method proceeds to include forming a substrate sealing ring on the BE dielectric surrounding the MEMS level and providing a cap having a cap inner surface and a cap outer surface. The cap inner surface includes a cap sealing ring which is bonded to the substrate bonding ring on the BE dielectric to hermetically seal the MEMS level.

In one embodiment, a device includes a substrate prepared with a complementary metal oxide semiconductor (CMOS) region with CMOS components and a BE dielectric with interconnections for interconnecting the CMOS components. The device further includes a MEMS level on the BE dielectric, the MEMS level includes a MEMS region with a MEMS component and the MEMS component includes recrystallized polysilicon structures. The MEMS level occupies a portion of the BE dielectric. The device also includes a substrate sealing ring on the BE dielectric surrounding the MEMS level and a cap having a cap inner surface and a cap outer surface. The cap inner surface includes a cap sealing ring which is bonded to the substrate bonding ring on the BE dielectric to hermetically seal the MEMS level.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 6b shows a structure simulated with laser annealing using the laser heat source of FIG. 6a.

DETAILED DESCRIPTION

Embodiments generally relate to devices, for example, semiconductor devices or integrated circuits (ICs) with an embedded micro-electro-mechanical system (MEMS) module. The IC, for example, is a complementary metal oxide semiconductor (CMOS) device. As for the MEMS module, it may include one or more thermoelectric-based infrared (IR) detectors. The MEMS detector is compatible with CMOS processing. The devices can be incorporated into products, such as thermal imagers. For example, a device may include a plurality of MEMS sensors which can be configured to form a sensor array for a thermal imager. The sensors may be used for other types of applications, such as single-pixel or line array temperature or motion sensors.

The fabrication of the devices may involve the formation of features on a substrate that makes up circuit components, such as transistors, resistors, capacitors, as part of a front-end-of-line (FEOL) processing. As part of back-end-of-line (BEOL) processing, interconnections are formed to interconnect the components, enabling the device to perform the desired functions. MEMS sensors are embedded on the device after BEOL processing. Furthermore, the process further includes encapsulating the MEMS sensors with a cap to hermetically seal the MEMS sensors.

To form the features, such as CMOS circuit components, interconnections and MEMS sensors, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes. Furthermore, a plurality of devices may be formed on the wafer in parallel. The devices are hermetically sealed with caps. In one embodiment, the devices are sealed at the wafer level. For example, the devices of the wafer are sealed with a cap wafer, sealing the devices in parallel, forming a wafer stack with the device wafer and cap wafer. The wafer stack is processed to singulate the encapsulated devices.

Figure 1:
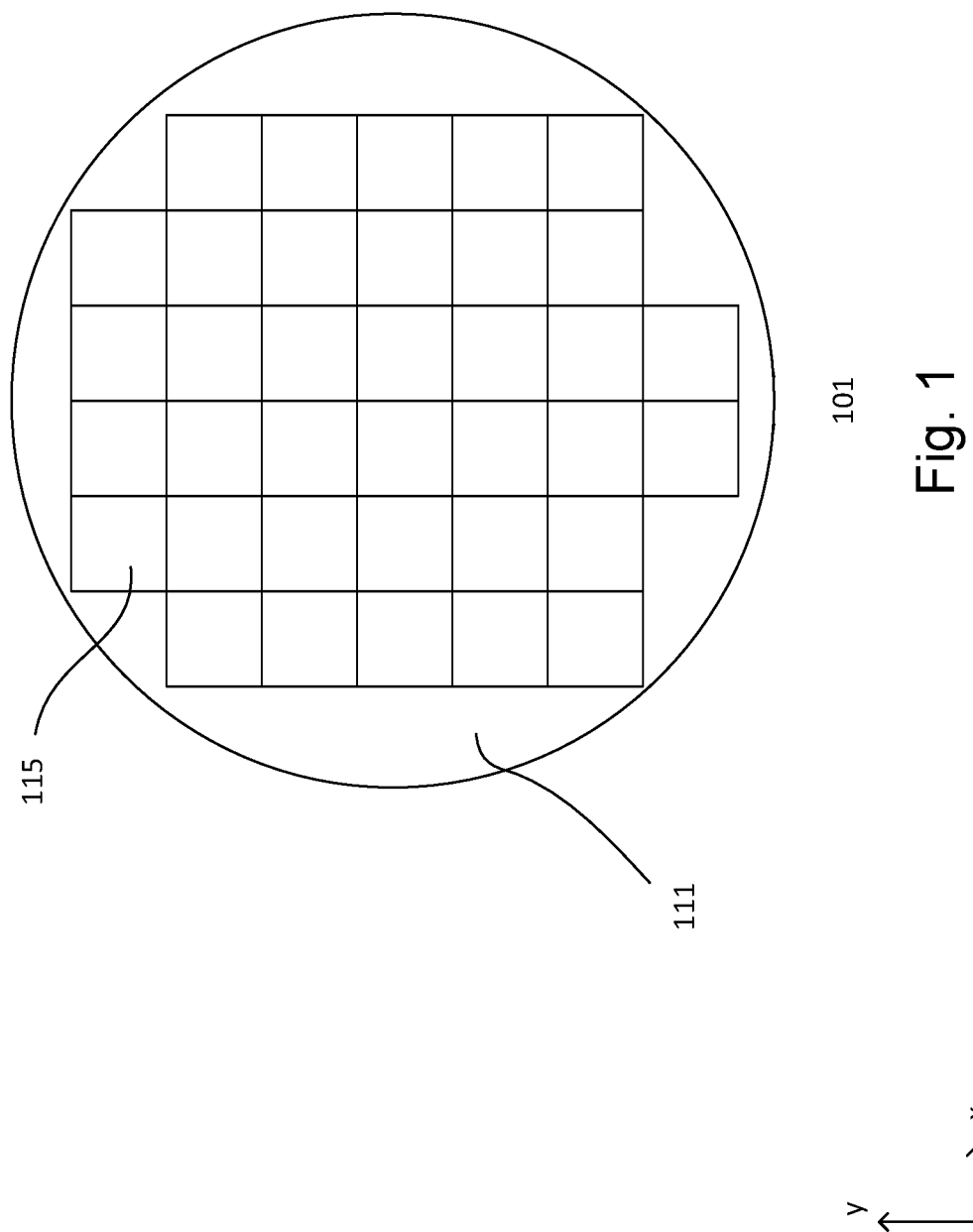
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon-germanium wafer, as well as wafers doped with other types of dopants or dopant concentrations, may also be useful.

The wafer includes an active surface 111 on which a device 115 is formed. A plurality of devices may be formed on the wafer in parallel. The devices, for example, are arranged in rows along a first (x) direction and columns along a second (y) direction. A cap wafer with processed caps is provided. The cap wafer, for example, is processed separately from the wafer. The cap wafer is bonded to the wafer with the devices, encapsulating the devices at the wafer level in parallel. The wafer stack is diced to singulate the devices into individual encapsulated chips. In one embodiment the wafer stack is partially diced to expose bond pads on the devices of the semiconductor wafer, followed by full dicing to singulate the encapsulated devices.

FIGS. 2a-2f show simplified cross-sectional views of embodiments of a device 200. The device, for example, is a CMOS device with an embedded MEMS structure or component. In one embodiment, the device is a CMOS device embedded with a thermoelectric-based infrared sensor. In some embodiments, the MEMS structure of the device includes a plurality of thermoelectric-based infrared sensors. The plurality of sensors may be configured to form a sensor array. For example, the device may be an infrared imager in which each sensor may be a pixel of an infrared imager. Other types of MEMS structures or applications may also be useful.

The device includes a substrate 201. The device, for example, may be a part of the wafer, as described in FIG. 1. Common elements may not be described or described in detail. The substrate, for example, may be a semiconductor substrate, such as a silicon substrate. The substrate, for example, may be a lightly doped p-type silicon substrate. Other types of substrates or wafers may also be useful.

In one embodiment, the substrate includes a CMOS region 210 with CMOS components. The CMOS region, for example, includes CMOS device regions with CMOS devices or components. The CMOS components may include metal oxide semiconductor (MOS) transistors, such as n-type MOS transistors and p-type MOS transistors. Other types of CMOS components, such as diodes, capacitors, and resistors may also be provided in the CMOS device regions. P-type MOS transistors and n-type MOS transistors are complementary types of transistors. A transistor includes a device well which serves as a body of the transistor. Additionally, a transistor includes a gate on the substrate and the gate is provided over the device well between first and second source/drain (S/D) regions disposed in the device well.

The gate of a transistor may include a gate electrode over a gate dielectric. The gate electrode may be polysilicon and the gate dielectric may be thermal silicon oxide. Other types of materials or configurations of gates may also be useful. For a p-type MOS transistor, the device well is an n-type well and the S/D regions are heavily doped p-type regions. On the other hand, an n-type transistor has a p-type device well and heavily doped n-type S/D regions. The S/D regions may include lightly doped extension regions. The lightly doped extension regions are lightly doped with the same polarity type dopants as the heavily doped S/D regions. The sidewalls of the gate may include dielectric spacers. The spacers facilitate in aligning the S/D and lightly doped extension regions. A device well may include a device well contact which is heavily doped with the same polarity type dopants as the device well.

The CMOS device regions may include different types of regions for different types of transistors having different operating characteristics or voltages. For example, low voltage transistors may be provided in low voltage (LV) region, intermediate or medium voltage transistor may be provided in a medium voltage (MV) region and high voltage transistors may be provided in a high voltage (HV) region. Other types of device regions may also be included. For example, a memory region may be included in which a memory array is disposed.

As discussed, the device may include a sensor array with a plurality of sensors arranged in a matrix with rows and columns of sensors. Each sensor corresponds to a pixel of an array of pixels. In such a case, the CMOS components may include select switches, row and column decoders and readout circuits. Other CMOS components may also be included. The CMOS components are configured to read out each pixel of the array. Once the full array of sensors is read out, an image may be reconstructed. The image, for example, is one frame corresponding to the sensors of the array.

Isolation regions are generally provided to isolate the CMOS components. For example, isolation regions are provided to CMOS device regions. In addition, isolation regions may be provided to isolate a device well contact from an S/D contact. Other configurations of isolation regions may also be useful. The isolation regions may be field oxide (FOX) isolation regions. Other types of isolation regions, such as shallow trench isolation (STI) regions, may also be useful.

An interlayer dielectric (ILD) layer 220 may be disposed on the substrate. The ILD layer covers the CMOS device regions with CMOS components. The ILD layer, for example, is a silicon oxide layer. Other types of dielectric layers or a combination of dielectric layers may also be useful.

Metal contact plugs, such as tungsten plugs, are provided in the ILD layer and are coupled to contact regions on the substrate and CMOS components. For example, contact plugs are coupled to S/D regions and gates of the CMOS components as well as to well taps for biasing the wells and substrate. Providing contact plugs for other types of contact regions may also be useful. The contact plugs, for example, may be formed by a damascene process. Other techniques for forming the contact plugs may also be useful.

A back-end-of-line (BEOL) dielectric 230 is provided on the substrate over the ILD layer 220. For example, the BEOL dielectric covers the CMOS region. The BEOL dielectric may include multiple intermetal dielectric (IMD) levels formed by BEOL dielectric layers. For example, the BEOL dielectric may include y IMD levels, where y is from 2-8. Other numbers of IMD levels, including 1, may also be useful, depending on the design and CMOS process. The ILD layer and BEOL dielectric may be referred to as a BE dielectric.

An IMD level may include a via dielectric level and a metal dielectric level. A via dielectric level and a metal dielectric level of an IMD level may be formed from one or more dielectric layers, depending on the design and process approach. The via dielectric level may be disposed above a metal dielectric level. Providing a metal dielectric level above a via dielectric level may also be useful. For example, a metal level (Mx) may be disposed below a first via level (Vx). For example, in the case of 3 IMD levels, x may be from 1 to 3. The metal dielectric level includes metal lines and the via dielectric level includes via contacts. The first metal level dielectric M1 is disposed over the ILD layer. Other configurations of BEOL dielectric layers may also be useful.

The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process. For example, metal lines of Mx and via contacts of Vx-1 are formed in the same process. In some embodiments, an IMD level may be formed by a combination of damascene and a reactive-ion etching (RIE) process. For example, metal lines may be formed by an RIE process while the contacts are formed by a single damascene process. In the case of an RIE process, a metal layer is formed and patterned by RIE using an etch mask to form the metal lines. It is understood that the different IMD levels of the BEOL dielectric may be formed using different techniques or combinations of techniques or processes. For example, the first IMD level may form contacts using a damascene process and metal lines using an RIE process, intermediate IMD levels may be formed using a dual damascene process. Alternatively, the IMD levels may be formed by a combination of damascene and RIE processes. Other configurations of forming the IMD levels may also be useful.

As for the top metal level of the BEOL dielectric, it may serve as a pad level with pad metal lines. The pad lines may be formed by a damascene or an RIE process. A passivation layer may be formed over the pad lines. The passivation layer, for example, may include one or more dielectric layers. In one embodiment, the passivation layer includes a silicon nitride layer over a silicon oxide layer, forming a $SiO_2$/SiN passivation stack. Other types of passivation layers or stacks may also be useful. Pad openings 235 may be provided in the passivation layer to expose the contact pads of the pad lines. Other approaches for forming the pad level may also be useful. The passivation layer may be considered the top dielectric layer of the BEOL dielectric.

The ILD and IMD levels may be planarized to form a planar top surface over the CMOS region. For example, CMP is performed on the substrate. Other planarization techniques, such as spin-on-glass (SOG) to fill the gaps or planarize the surface of the substrate, may also be useful. The overall thickness of the ILD and IMD levels over the structure may be from 100-400 nm. Providing any other thicknesses for the IMD levels may also be useful.

Above the BEOL dielectric is a MEMS level 240. In one embodiment, the MEMS level is a monolithically integrated MEMS level. For example, the MEMS level is formed over the BEOL dielectric using CMOS processes. In one embodiment, the MEMS level is formed over the BEOL dielectric using CMOS processes which are post CMOS compatible processes. Monolithic integration of the MEMS level leads to reduced device footprint as well as reduced manufacturing costs. In addition, other advantages include, for example, larger fill factor and shorter interconnect lengths which results in faster and smaller parasitic for sensor readout.

In one embodiment, the MEMS level 240 is disposed on and within the BEOL dielectric of the device. For example, the MEMS level occupies a portion of the BEOL dielectric. The MEMS level defines a MEMS region 245 of the device. In other words, the MEMS region or MEMS level is surrounded by the CMOS region below. The MEMS region is configured with a MEMS component. In one embodiment, the MEMS component is a sensor array with sensors. A sensor may be disposed within a MEMS device region of the MEMS region. For example, each sensor may be located in its respective MEMS device region. The sensors of the array, in one embodiment, are thermoelectric-based IR MEMS sensors. Providing the MEMS region with other types of MEMS sensors may also be useful. The sensors may be configured as a matrix with M rows and N columns of sensors, forming a M×N array. Typical array sizes may include, for example, a 32×32 array or a 80×64 array. Other array sizes may also be useful. The size of the array may depend on, for example, the desired image resolution. In some cases, the array may be a line of sensors, such as a M×1 or 1×N array. Providing the MEMS region with a single MEMS sensor may also be useful. A sensor may correspond to a pixel of an array of pixels of an image. In addition, the sensor array may also include one or more blind sensors corresponding to one or more blind pixels. Blind pixels, for example, are used for calibration purposes.

In one embodiment, the MEMS level includes a base dielectric layer. The base dielectric layer forms a bottom of the MEMS level. For example, the base dielectric layer contacts the passivation layer of the BEOL dielectric. The base dielectric layer may be a silicon oxide layer. Other types of dielectric layers may also be useful. IR reflectors are disposed on the base dielectric layer for the MEMS sensors. The IR reflectors may be metal IR reflectors. For example, the metal IR reflectors may be formed of titanium (Ti), tungsten (W) or aluminum. Other types of IR reflectors which are post CMOS compatible may also be useful.

In one embodiment, the MEMS level includes a sacrificial layer disposed over the base layer and IR reflectors. The sacrificial layer is used to facilitate the structure of a lower sensor cavity. The sacrificial layer, in one embodiment, is an amorphous silicon ($\alpha$Si) layer. Other types of sacrificial layers may also be useful.

A MEMS dielectric layer is disposed on the sacrificial layer. The MEMS dielectric layer, for example, may be a silicon oxide layer. Other types of dielectric layers may also be useful. In some cases, the dielectric layer may be a dielectric layered stack. The MEMS dielectric layer serves as a membrane on which MEMS structures of the sensors of the sensor array are disposed. In one embodiment, the MEMS structures are thermopile line structures which serve as thermoelectric IR sensors or detectors. The thermopile line structures may be similar to those described in, for example, U.S. Ser No. 16/517,653, U.S. Pat. No. 10,403,674, U.S. Ser No. 16/224,782, and U.S. Pat. No. 10,199,424, which are all already herein incorporated by reference for all purposes. Other types of MEMS structures or sensors, including non-IR sensors, may also be disposed in the MEMS region.

A thermopile line structure, in one embodiment, includes first and second polarity doped thermoelectric line segments. In one embodiment, the thermoelectric line structure includes doped polysilicon. In one embodiment, the doped polysilicon is recrystallized amorphous silicon using laser annealing. Other types of thermoelectric materials may also be used for the thermopile line structure. A metal contact may be used to couple the first and second polarity doped line segments of the thermopile line structure. The metal contact may be disposed at the interface of the first and second polarity doped segments. The metal contact, for example, is a Ti or Al alloy contact. Other types of metallic contacts may also be useful. A first sensor terminal is coupled to the first polarity doped thermoelectric line segment and a second sensor terminal is coupled to the second polarity doped thermoelectric line segment material. The terminals may be part of the doped thermoelectric materials.

An absorber layer may be provided over the line structures. The absorber layer, for example, is configured to absorb incident IR radiation. The absorber layer may be a titanium nitride (TiN) layer. Other types of absorber layers may also be useful. For example, the absorber layer may be a nickel-chromium (NiCr) layer or a doped silicon layer. In one embodiment, the absorber is configured to absorb most of the incident IR radiation. For example, the absorber may be configured to absorb greater than 85% of incident IR radiation having a wavelength of 8-14 µm. Providing any other configurations may also be useful. In other embodiments, the absorber is configured to absorb incident radiation having a wavelength of 2-5 µm. For example, another harmonic of the interferometric absorber is used. In one embodiment, the absorber is configured to absorb >50% of incident radiation having a wavelength of 2-5 µm.

A sensor protection layer, in one embodiment, is disposed over the absorber layer. The sensor protection layer serves to protect the sensor from subsequent etch processes. For example, the protection layer serves to protect the line structure and absorber layer from etchants, such as $XeF_2$, used in a release process to form a lower sensor cavity. In one embodiment, the protection layer is a silicon oxide layer. Other types of layers which are transparent to IR radiation and are selective to the etchant used in a release process to form the lower sensor cavity may also be useful.

Release openings are provided in the MEMS dielectric layer and other layers above, such as the absorber layer and the protective layer, to enable removal of the sacrificial layer during a release process to form the lower sensor cavity. In one embodiment, the lower sensor cavity has a height (between the bottom and top) selected for optimal reflection of the desired wavelengths of IR radiation by the reflector. The height, for example, may be defined by the thickness of the sacrificial layer. In one embodiment, the height of the lower sensor cavity is sufficient to ensure a ¼ wavelength optical distance between the absorber and reflector. For example, the optical distance may be about 2-3 µm for detecting IR radiation having a wavelength of 8-12 µm. Other distances may also be useful, depending on the wavelength to be detected. For example, by decreasing or increasing the optical distance, IR radiation with smaller or larger wavelengths can be detected respectively. The optical distance is defined as the distance where the IR radiation wave possesses an optical path going through several layers.

MEMS to CMOS (MC) contacts may be provided in the MEMS level. The MC contacts provide electrical connections of the MEMS sensors of the array to the CMOS components in the CMOS region. The MC contacts may be through layer via (TLV) contacts. The MC contacts, for example, are coupled to the terminals of the sensors and a top metal or pad level, which connects to the CMOS components in the CMOS region. In one embodiment, MC contacts are provided for each sensor of the array. For example, first and second MC contacts are provided for the first and second terminals of each sensor.

In one embodiment, the lower sensor cavity is a common lower sensor cavity of the sensor array. For example, a single lower sensor cavity serves as a common lower sensor cavity for the sensors of the sensor array. The bottom sensor cavity is defined by the base dielectric layer with the reflectors while the top of the lower sensor cavity is defined by the patterned MEMS dielectric layer. The cavity has no sidewalls. For example, after the removal of the sacrificial layer, the MEMS dielectric layer with the sensor structures is mechanically supported by the MC contacts.

A cap 250 is disposed on the substrate, encapsulating the MEMS region. The cap, for example, is bonded to the top of the BEOL dielectric to form a vacuum over the MEMS region. The cap, in one embodiment, is formed of a material which is transparent to infrared radiation. For example, the cap is capable of transmitting infrared radiation to the sensor. The cap may be a silicon (Si) cap. Other types of materials, such as germanium (Ge), silicon-germanium (SiGe) or zinc sulfide (ZnS), may also be used to form the cap. Providing a cap formed from other types of materials which transmit infrared radiation may also be useful.

In one embodiment, the cap includes an anti-reflective region 260. The anti-reflective region facilitates the transmission of infrared radiation through the cap. In one embodiment, the anti-reflective region includes a bottom grating on the inner (bottom) surface of the cap and a top grating on the outer (top) surface of the cap. The gratings can have a moth-eye grating pattern or structure to facilitate the transmission of infrared radiation. The gratings may have other types of patterns which facilitate the transmission of infrared radiation. The gratings may be formed by etching the surfaces of the cap. In one embodiment, the gratings are configured to reduce refraction and reflection of incoming IR light. In some embodiments, one of the surfaces may be provided with a surface grating. For example, the top or the bottom surface may be provided with a surface grating. Other configurations of gratings may also be employed.

In another embodiment, the anti-reflective region includes anti-reflection coating disposed on the front and back sides of the cap. For example, the anti-reflection coating is provided instead of surface gratings or patterns. Providing the anti-reflection coating on one of the surfaces may also be useful. For example, the anti-reflection coating can be disposed on the top or bottom surface. Materials with different reflective indexes may be deposited alternatively on the surfaces of the anti-reflective region. For example, materials for the anti-reflection coating may be zinc sulfide (ZnS) or germanium (Ge). Providing any other materials and deposition techniques for the anti-reflection coating may also be useful. The anti-reflection coating may be deposited on the surfaces of the cap and patterned to remain in the anti-reflective region. In the case where one of the cap surfaces includes a surface pattern, the other cap surface may include an anti-reflection coating. For example, the anti-reflective region includes a combination of a surface pattern on one cap surface and an anti-reflective coating on the other cap surface.

In one embodiment, a getter 270 is disposed on the inner surface of the cap. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth elements including cerium (Ce) or lanthanum (La) may also be useful. The getter facilitates the maintenance of the vacuum, improving reliability. In one embodiment, the getter is disposed outside of the MEMS region 245 of the MEMS level 240 and the anti-reflective region 260 of the cap.

A sealing ring 280 is employed to facilitate bonding the cap to the substrate. The sealing ring, for example, includes a cap sealing ring 280a and a substrate sealing ring 280b. The substrate sealing ring is disposed on, for example, the BEOL dielectric surrounding the MEMS level. The cap and substrate sealing rings are mated, bonding the cap to the substrate. In one embodiment, the sealing rings may be a metal or metal alloy. The sealing rings may be gold-based sealing rings, such as gold, gold-tin or a combination thereof. Providing other materials and structures for the sealing rings may also be useful. For example, aluminum, copper, silver titanium, germanium, tin, titanium nitride, silicon oxide, silicon nitride or a combination thereof, including gold and gold-tin. In one embodiment, the sealing rings are mated by thermal compression. Other techniques for bonding the cap to the substrate by forming thermal compression bonds or eutectic bonds may also be useful.

The cap, when bonded to the substrate, forms a cap cavity 252, encapsulating the MEMS region 245 inside the cap bonding region 251. In one embodiment, the cap hermetically seals the MEMS region. The volume of the cavity, for example, may be defined by the height of the sealing ring. Furthermore, the desired distance between the anti-reflective region and the sensors can be determined by the height of the sealing rings. As discussed, the lower sensor cavity, in one embodiment, does not have cavity sidewalls. For example, the lower sensor cavity is in communication with the cap cavity.

Figure 2A:
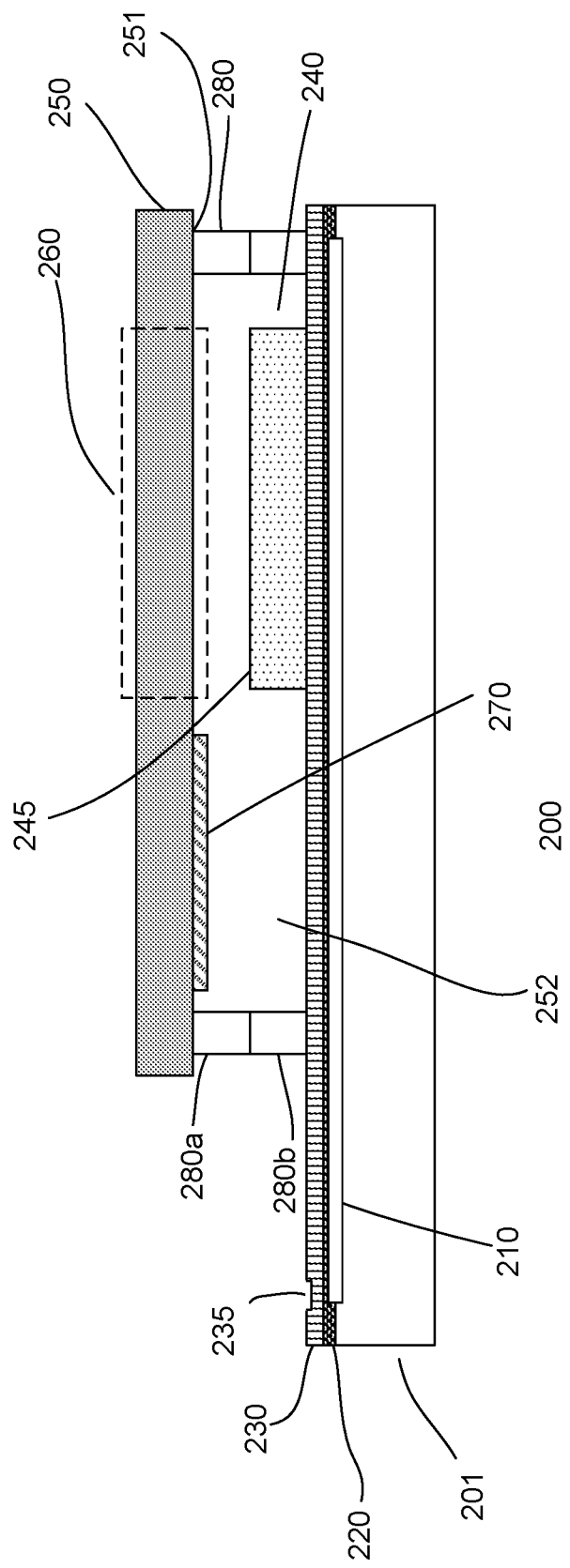
FIGS. 2a-2f show simplified cross-sectional views of embodiments of a device.

Referring to FIG. 2a, the cap includes planar or substantially planar inner and outer surfaces. It is understood that the anti-reflective regions may include surface patterns and/or anti-reflection coatings, making it substantially planar. However, planar includes planar and substantially planar. As such, the volume and distance between the anti-reflective region are determined by the height of the sealing ring.

Figure 2B:
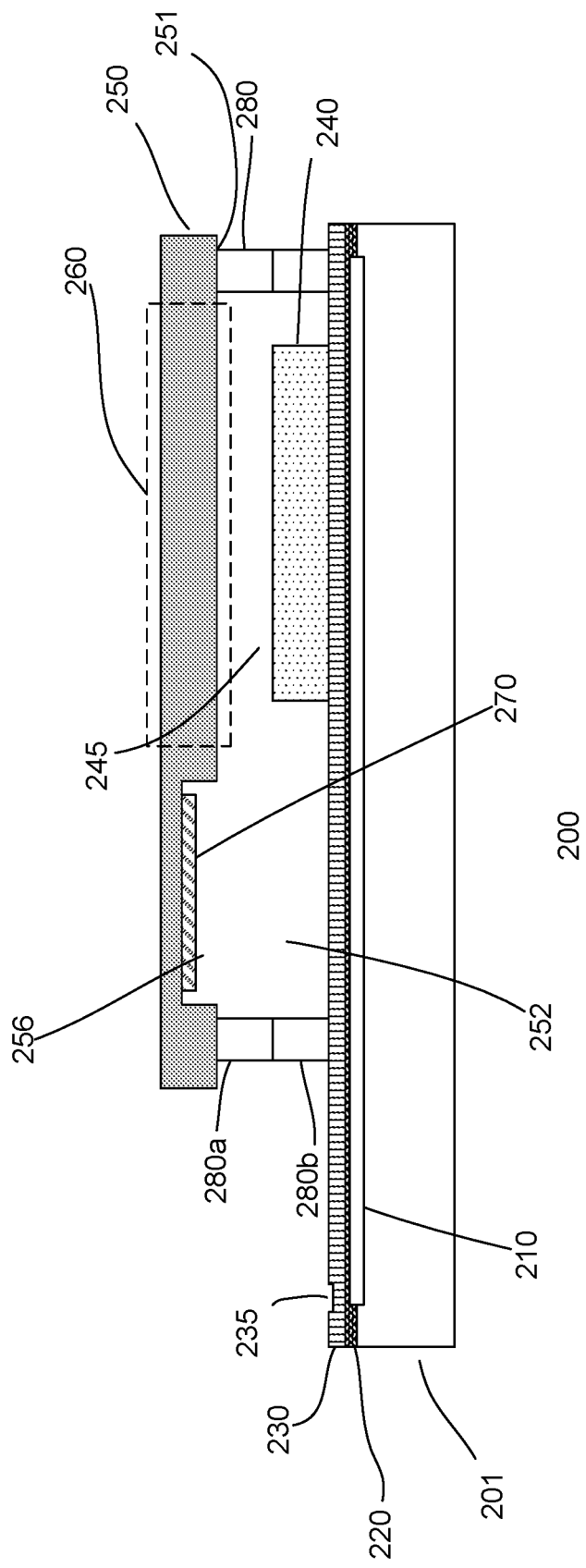

In another embodiment, as shown in FIG. 2b, the cap includes a cap recess 256 on the inner surface thereof. The cap recess, for example, is disposed on a bottom surface of the cap outside of the anti-reflective region. The cap recess may have a square or rectangular footprint or shape. Other shapes for the cap recess may also be useful. Depending on the thickness of the cap wafer, the cap recess may have a depth ranging from 10, 20, 30, 100 to 500 um. Having a cap recess which is deeper than 500 um may also be useful. In one embodiment, the cap recess improves an overall vacuum level within the cavity. For example, the cap recess increases the overall volume of the cap cavity between the cap and MEMS level. The larger volume improves the overall vacuum level after bonding of the cap wafer to the device substrate. As such, better imaging qualities can be captured from the device.

In one embodiment, a getter 270 is disposed on an inner surface of the cap recess. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth elements including cerium (Ce) or lanthanum (La) may also be useful. The getter facilitates the maintenance of the vacuum, improving reliability.

Figure 2C:
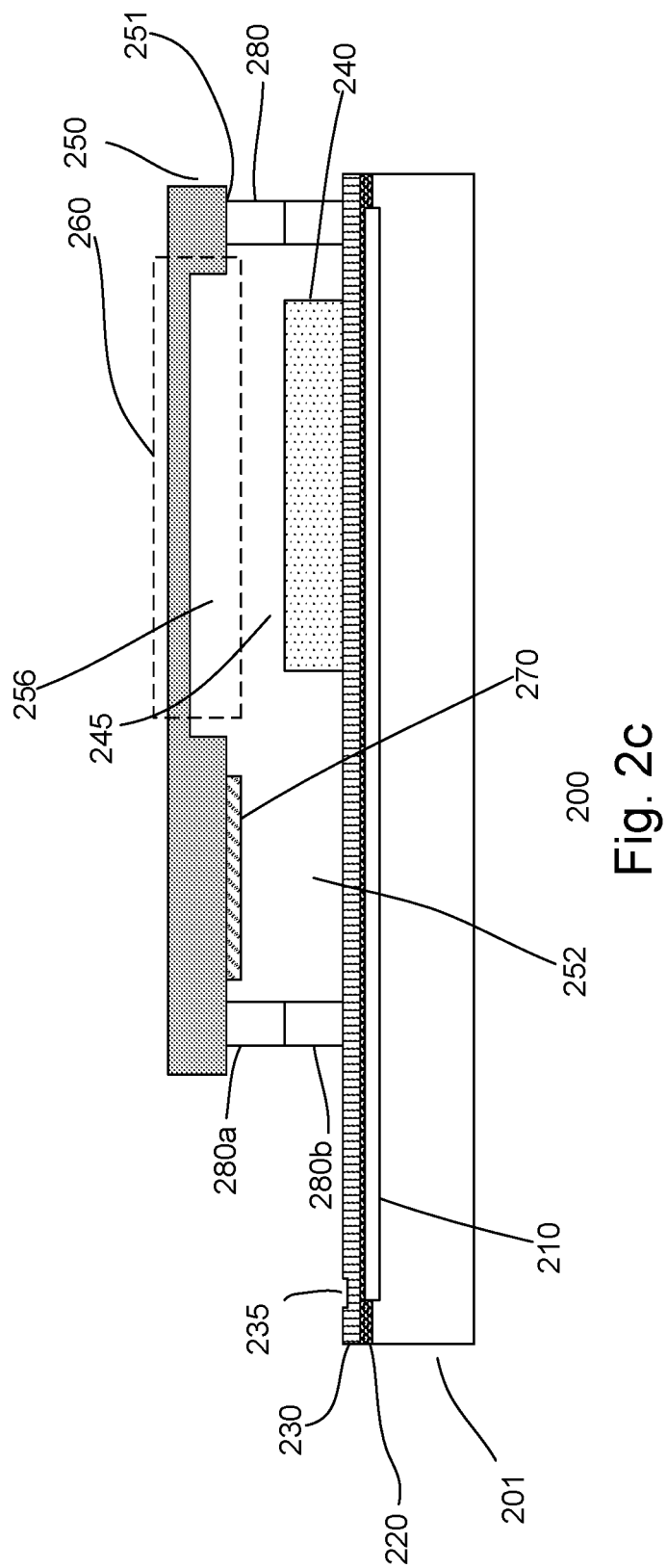

In yet another embodiment, as shown in FIG. 2c, a cap is provided, except that the cap recess 256 is disposed over the MEMS region 245. Providing the anti-reflective region 260 in the cap recess enables the distance between the anti-reflective region and the sensors to be additionally controlled by the depth of the cap recess which is independent of the height of the sealing ring. A getter 270 may be disposed on an inner surface of the cap outside of the cap recess. The getter absorbs moisture and outgassing within the encapsulated device. The getter facilitates the maintenance of the vacuum, improving reliability.

Figure 2D:
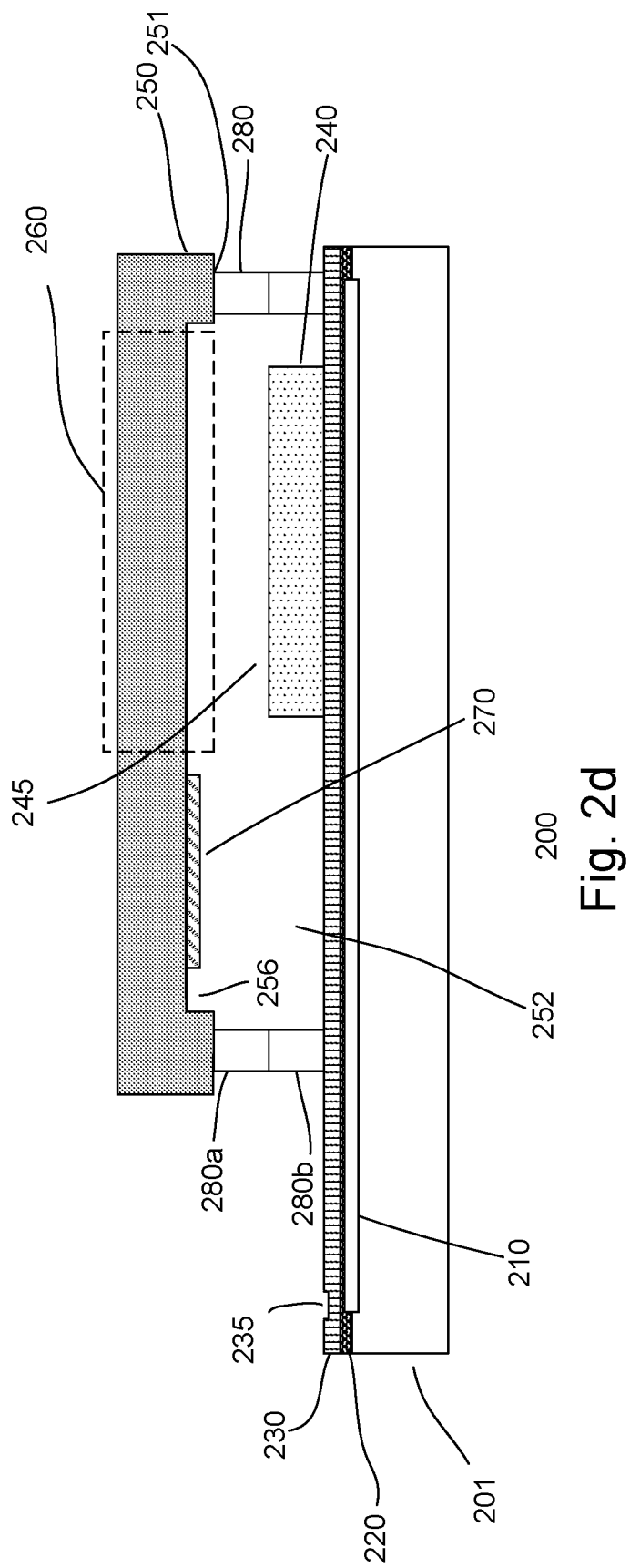

In another embodiment, as shown in FIG. 2d, a cap 250 is provided. The cap is processed to include a cap recess 256. The cap recess, for example, is disposed inside of the cap bonding region 251 of the cap with the cap sealing ring 280a. For example, the cap bonding region is at the periphery of the inner surface of the cap surrounding the cap recess. The cap recess increases the volume of the overall cap cavity for a given sealing ring height. Furthermore, the depth can be increased by increasing the depth of the cap recess without increasing the sealing ring height. A getter 270 may be disposed on an inner surface of the cap recess outside of the anti-reflective region 260 over the MEMS region 245. The getter absorbs moisture and outgassing within the encapsulated device. The getter facilitates the maintenance of the vacuum, improving reliability.

Figure 2E:
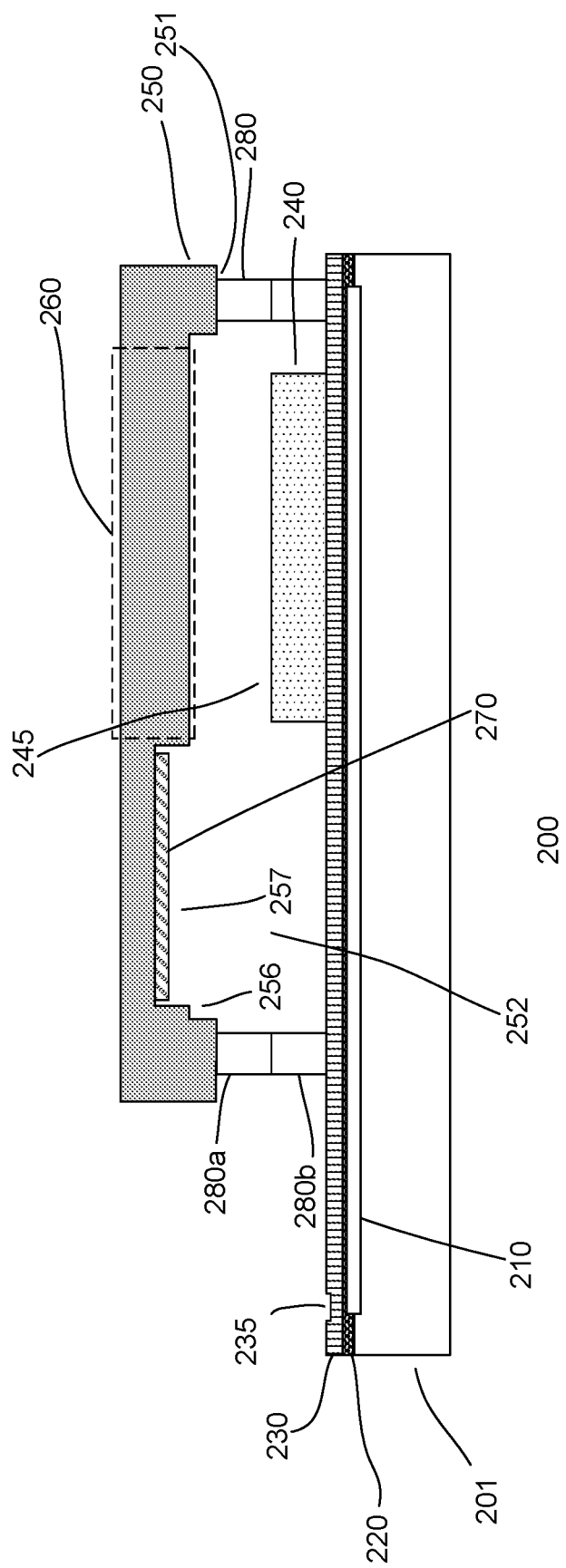

As shown in FIG. 2e, a cap 250 with shallow and deep cap recesses 256 and 257 are provided. The shallow cap recess, similar to the cap recess of FIG. 2d, is surrounded by a cap bonding region 251 of the cap with the cap sealing ring 280a. In addition, the deep cap recess is disposed outside of the anti-reflective region 260 of the cap. The deep recess increases the volume of the cap cavity 252. A getter 270 may be disposed on an inner surface of the deep recess outside of the anti-reflective region 260. The getter absorbs moisture and outgassing within the encapsulated device. The getter facilitates the maintenance of the vacuum, improving reliability.

Figure 2F:
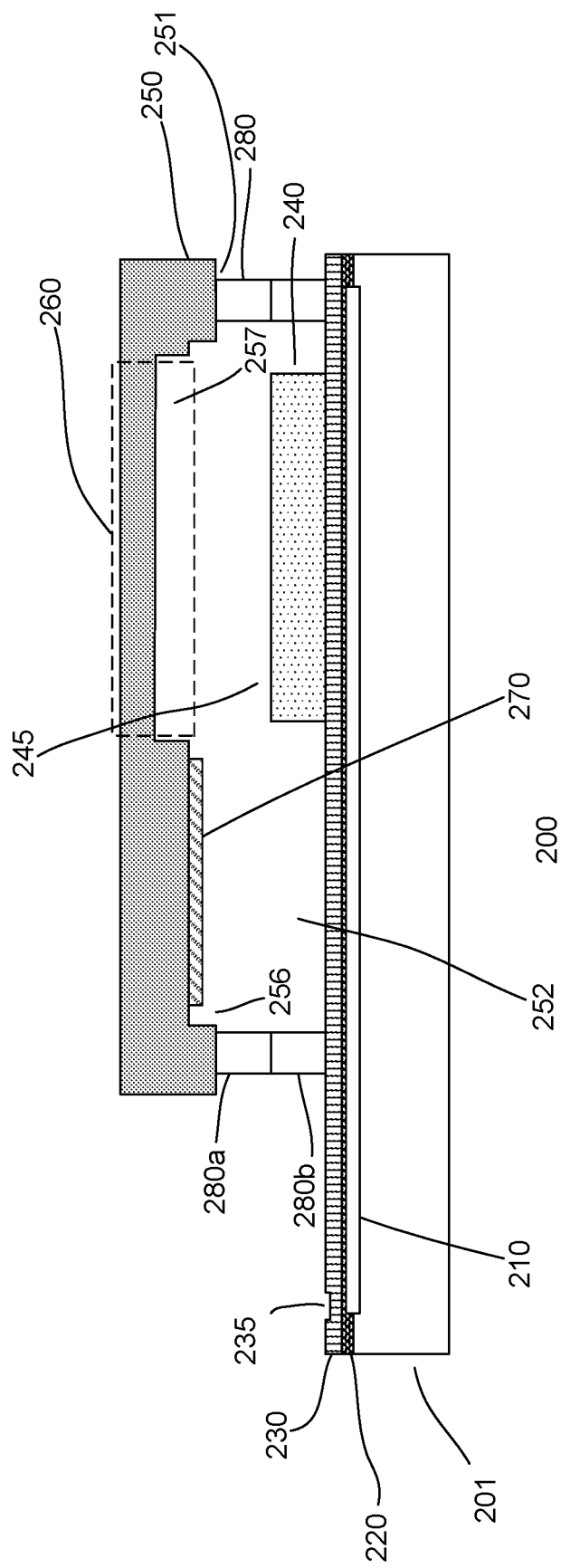

In another embodiment, as shown in FIG. 2f, a cap 250 is provided. The cap is similar to the cap of FIG. 2e, except that, like FIG. 2c, the deep cap recess 257 is disposed over the MEMS region. For example, the anti-reflective region 260 located within the deep cap recess. A getter 270 may be disposed on an inner surface of the shallow cap recess 256 outside of the deep cap recess. The getter absorbs moisture and outgassing within the encapsulated device. The getter facilitates the maintenance of the vacuum, improving reliability.

Figure 3:
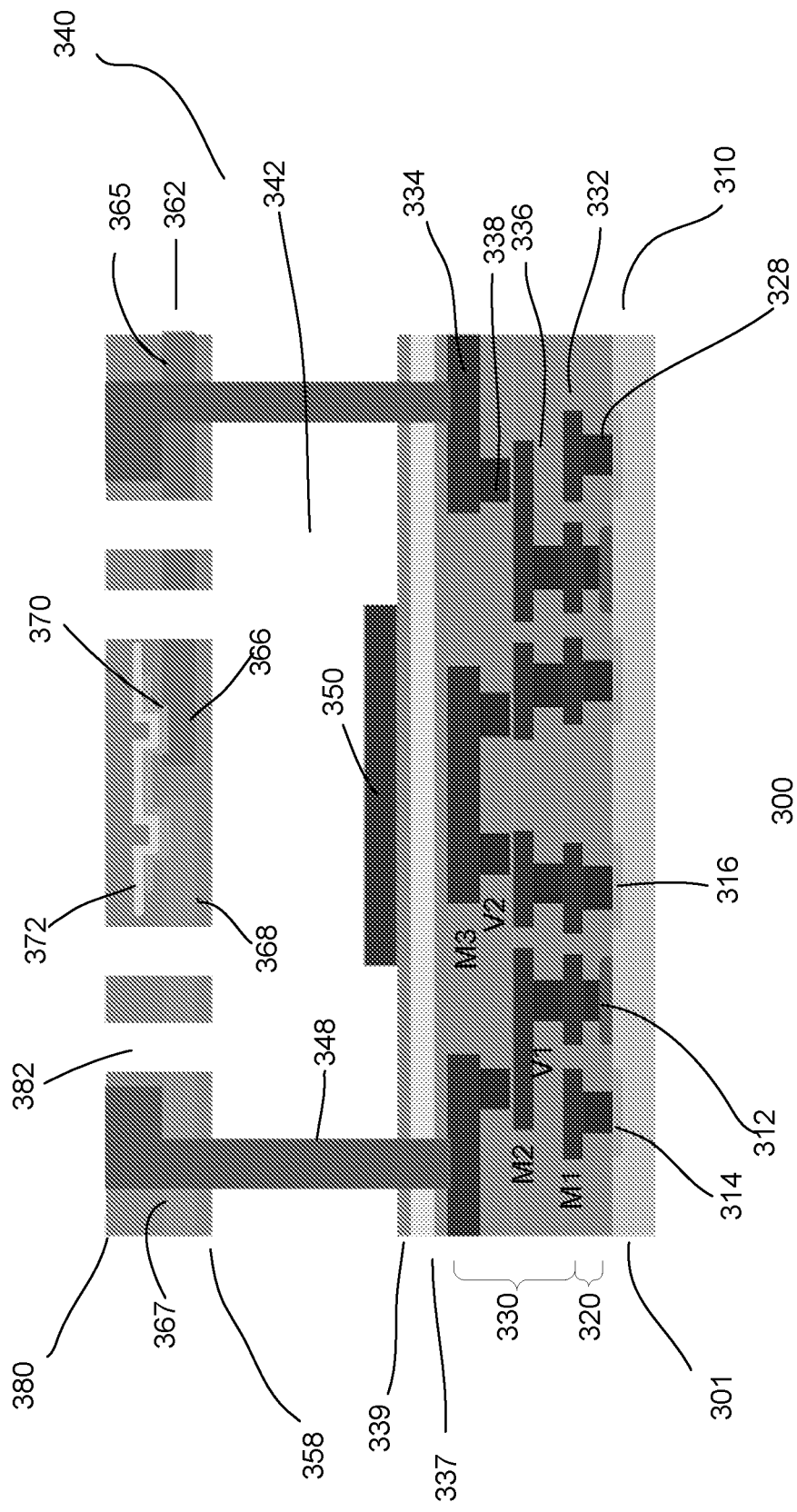
FIG. 3 shows a cross-sectional view of a portion of a device in greater detail.

FIG. 3 shows a simplified cross-sectional view of a portion of an embodiment of a device 300. As shown, the device includes a portion of the device with the CMOS region and a MEMS device region of the MEMS region. The device may be similar to the devices of FIGS. 2a-2f, but without the cap. Common elements may not be described or described in detail.

The device includes a substrate 301. The substrate, for example, may be a semiconductor substrate, such as a silicon substrate. The substrate, for example, may be a lightly doped p-type silicon substrate. Other types of substrates or wafers may also be useful.

In one embodiment, the substrate includes a CMOS region 310 with CMOS components in CMOS device regions. The CMOS components may include metal oxide semiconductor (MOS) transistors, such as n-type MOS transistors and p-type MOS transistors. As shown, the portion of the device includes first and second transistors, each with a gate 312 between S/D regions 314 and 316. The MOS transistors may be n-type, p-type or a combination of n-type and p-type MOS transistors. The CMOS region may also include other types of CMOS components, such as diodes, capacitors, and resistors. Isolation regions may be provided to isolate the CMOS components. For example, isolation regions are provided to isolate the first and second CMOS device regions with the first and second transistors.

An interlayer dielectric (ILD) layer 320 may be disposed on the substrate. The ILD layer covers the substrate and CMOS region with CMOS components. The ILD layer, for example, is a silicon oxide layer. Other types of dielectric layers or a combination of dielectric layers may also be useful. Metal contact plugs 328, such as tungsten plugs, are provided in the ILD layer and are coupled to contact regions on the substrate and CMOS components. For example, contact plugs are coupled to S/D regions and gates of the CMOS components as well as to well taps for biasing the wells and substrate. Providing contact plugs for other types of contact regions may also be useful. The contact plugs, for example, may be formed by a damascene process. Other techniques for forming the contact plugs may also be useful.

A back-end-of-line (BEOL) dielectric 330 is provided on the substrate over the ILD layer 320. The BEOL dielectric may include multiple intermetal dielectric (IMD) levels formed by BEOL dielectric layers. For example, the BEOL dielectric may include y IMD levels, where y is from 2-8. Other numbers of IMD levels, including 1, may also be useful, depending on the design and CMOS process. The ILD layer and BEOL dielectric may be referred to as a BE dielectric.

An IMD level may include a via dielectric level 336 and a metal dielectric level 332. A via dielectric level and a metal dielectric level of an IMD level may be formed from one or more dielectric layers, depending on the design and process approach. The via dielectric level may be disposed above a metal dielectric level. For example, a metal level (Mx) may be disposed below a first via level (Vx). For example, as shown, the BEOL includes 3 IMD levels (x=1 to 3). The metal dielectric level includes metal lines 334 and the via dielectric level includes via contacts 338. The first metal level dielectric M1 is disposed over the ILD layer. Other configurations of BEOL dielectric layers may also be useful.

The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process. For example, metal lines of Mx and via contacts of Vx-1 are formed in the same process. In some embodiments, an IMD level may be formed by a combination of damascene and a reactive-ion etching (RIE) process. For example, metal lines may be formed by an RIE process while the contacts are formed by a single damascene process. In the case of an RIE process, a metal layer is formed and patterned by RIE using an etch mask to form the metal lines. It is understood that the different IMD levels of the BEOL dielectric may be formed using different techniques or combinations of techniques or processes. For example, the first IMD level may form contacts using a damascene process and metal lines using an RIE process, intermediate IMD levels may be formed using a dual damascene process. Alternatively, the IMD levels may be formed by a combination of damascene and RIE processes. Other configurations of forming the IMD levels may also be useful.

As for the top metal level (e.g., M3) of the BEOL dielectric, it may serve as a pad level with pad metal lines. The pad lines may be formed by a damascene or an RIE process. A passivation layer 337 may be formed over the pad lines. The passivation layer, for example, may include one or more dielectric layers. In one embodiment, the passivation layer includes a silicon nitride layer over a silicon oxide layer, forming a $SiO_2$/SiN passivation stack. Other types of passivation layers or stacks may also be useful. Pad openings may be provided in the passivation layer to expose the contact pads of the pad lines. Other approaches for forming the pad level may also be useful.

The ILD and IMD levels may be planarized to form a planar top surface over the CMOS region. For example, CMP is performed on the substrate. Other planarization techniques, such as spin-on-glass (SOG) to fill the gaps or planarize the surface of the substrate, may also be useful.

A MEMS level 340 is disposed over the BEOL dielectric. The MEMS level, in one embodiment, is a monolithically integrated MEMS level. In one embodiment, the MEMS level includes a base or buffer layer 339. The base layer is a dielectric base layer, such as silicon oxide. The base layer, for example, serves as an etch stop layer. As discussed, the cross-sectional view is a MEMS device region of a sensor, such as an IR sensor, of a MEMS array.

As shown, the MEMS device region includes a lower sensor cavity 342. The base layer, for example, serves as the bottom of the lower sensor cavity. The lower sensor cavity, in one embodiment, is a common lower sensor cavity of the sensor array. For example, the sensors of the sensor array share the same lower sensor cavity.

An IR reflector 350 is disposed on the bottom of the lower sensor cavity. The IR reflector, for example, may be a metal IR reflector. For example, the metal IR reflector may be formed of titanium (Ti), tungsten (W) or aluminum (Al). Other types of IR reflector which are post CMOS compatible may also be useful.

A MEMS dielectric layer 358 forms a top of the lower sensor cavity. The MEMS dielectric layer, for example, may be a silicon oxide layer. Other types of dielectric layers may also be useful. In some cases, the dielectric layer may be a dielectric layered stack. The MEMS dielectric layer serves as a membrane on which a MEMS structure 362 of the sensor is disposed. In one embodiment, the MEMS structure 362 is a thermopile line structure which serves as a thermoelectric IR sensor or detector. Other types of MEMS structures or sensors, including non-IR sensors, may also be disposed in the sensor region.

A thermopile line structure, in one embodiment, includes first and second polarity doped thermoelectric line segments 366 and 368. In one embodiment, the thermoelectric line structure includes doped polysilicon. In one embodiment, the doped polysilicon is recrystallized amorphous silicon using laser annealing. The laser annealing may recrystallize the amorphous silicon as well as activate the dopants. Other types of thermoelectric materials which are post CMOS compatible may also be used for the thermopile line structure.

A metal contact 370 may be used to couple the first and second polarity doped line segments of the thermopile line structure. The metal contact may be disposed at the interface of the adjacent ends or interface of the segments of the line structure. Other types of metallic contacts may also be useful. A first sensor terminal 365 is coupled to the first polarity doped thermoelectric line segment and a second sensor terminal 367 is coupled to the second polarity doped thermoelectric line segment material. The terminals may be part of the doped thermoelectric materials.

An absorber layer 372 may be provided over the line structure. The absorber layer, for example, is configured to absorb incident IR radiation. The absorber layer may be a titanium nitride (TiN) layer. Other types of absorber layers may also be useful. For example, the absorber layer may be a nickel-chromium (NiCr) layer or a doped silicon layer. In one embodiment, the absorber is configured to absorb most of the incident IR radiation. For example, the absorber may be configured to absorb greater than 85% of incident IR radiation having a wavelength of 8-14 µm. Providing any other configurations may also be useful. In other embodiments, the absorber is configured to absorb incident radiation having a wavelength of 2-5 µm. For example, another harmonic of the interferometric absorber is used. In one embodiment, the absorber is configured to absorb >50% of incident radiation having a wavelength of 2-5 µm.

A sensor protection layer 380, in one embodiment, is disposed over the absorber layer. The sensor protection layer serves to protect the sensor from subsequent etch processes. For example, the protection layer serves to protect the line structure and absorber layer from etchants, such as $XeF_2$, used in a release process to form the lower device cavity. In one embodiment, the protection layer is a silicon oxide layer. Other types of layers which are transparent to IR radiation and are selective to the etchant used in a release process to form the lower device cavity may also be useful. In one embodiment, the sensor protection layer may include multiple dielectric layers. For example, a first dielectric layer is provided over the line structure and patterned to form openings for the contacts. The metal contact and the absorber layer are formed and then a top protective layer is provided, covering the line structure and absorber layer.

Release openings 382 are provided in the dielectric base layer and other layers above, such as the protective layer, to enable removal of lower sensor cavity sacrificial material during a release process to form the lower sensor cavity.

MEMS to CMOS (MC) contacts 348 may be provided in the MEMS level. The MC contacts provide electrical connections of the MEMS sensors to the CMOS components in the CMOS region. The MC contacts, for example, are coupled to the terminals of the sensors and a top metal or pad level of the BEOL dielectric, which connects to the CMOS components in the CMOS region. In one embodiment, MC contacts are provided for each sensor of the array. For example, first and second MC contacts are provided for first and second terminals of each sensor. The MC contacts provide mechanical support for the MEMS dielectric layer with the sensors after the release process.

A cap encapsulates the MEMS region of the MEMS level. The cap forms an upper sensor cavity. In one embodiment, the cap forms a common upper sensor cavity for the sensors of the MEMS region. Pad openings are provided to expose pads in the CMOS region at the periphery of the MEMS level.

Figure 4A:
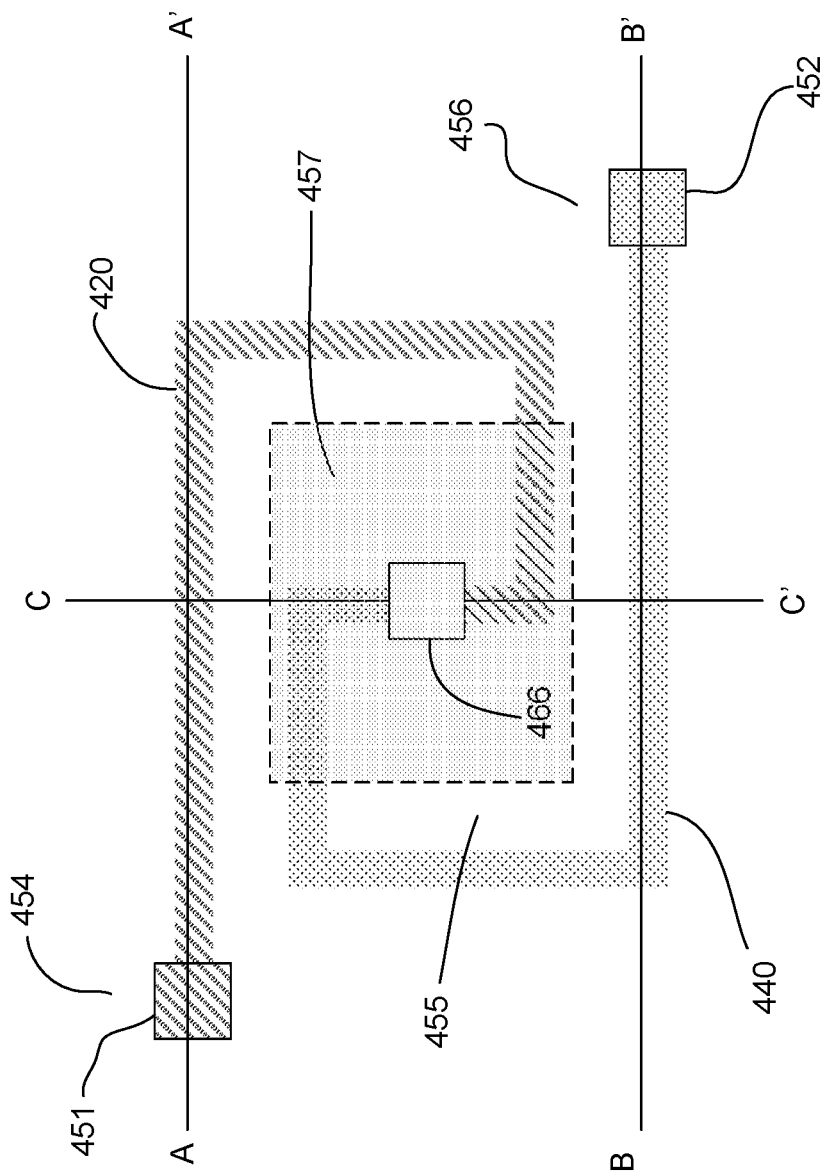
FIGS. 4a-4b show top and cross-sectional views of an exemplary embodiment of a thermopile structure for an IR sensor.
Figure 4B:
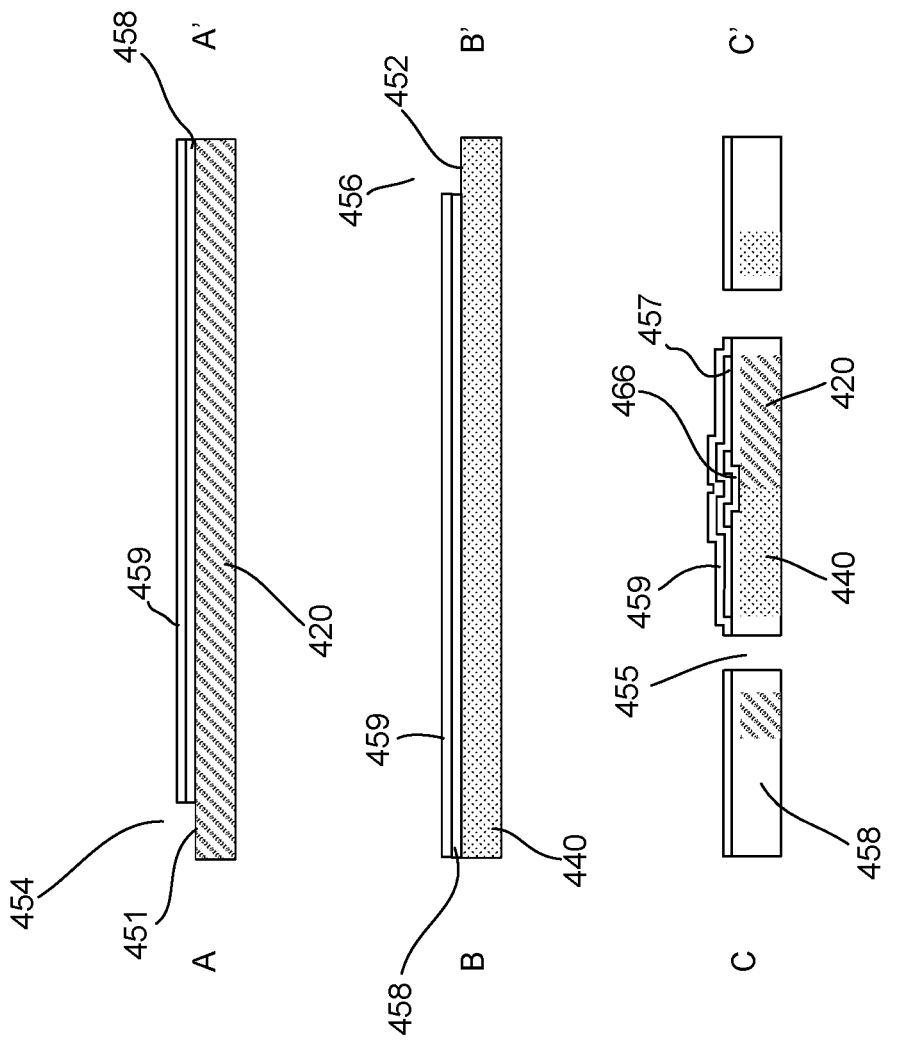

FIG. 4a shows a simplified top view of an embodiment of a MEMS sensor or structure 450 and FIG. 4b shows various cross-sectional views of the MEMS structure along A-A', B-B' and C-C'. The top view excludes the protective layer. The MEMS structure is a line structure. The line structure is a thermopile which serves as a thermoelectric IR sensor or detector. The line structure is disposed on the membrane or dielectric layer which defines the top of the lower device cavity. The line structure, in one embodiment, includes a single line unit (N=1) which has a meandering shape and occupies the surface of the membrane.

In one embodiment, the line unit includes recrystallized amorphous silicon. Other types of line units may also be useful. For example, thermoelectric materials which are post CMOS compatible may be employed to form the line structure.

The line unit includes first and second line segments 420 and 440. A first end 451 is part of the first line segment and a second end 452 is part of the second line segment. In one embodiment, the first and second ends may serve as cold junctions of a thermopile. A first line structure terminal 454 is disposed at the first end and a second line structure terminal 456 is disposed at the second end. The terminals, for example, are part of the line unit of the line structure. The terminals serve as terminals of the MEMS structure or sensor.

In one embodiment, the first line segment is doped with first polarity type dopants and the second line segment is doped with second polarity type dopants. For example, the first line segment is heavily doped with first polarity type dopants and the second line segment is heavily doped with second polarity type dopants. The first polarity type may be p-type and the second polarity type may be n-type. Providing first polarity type which is n-type and second polarity type which is p-type may also be useful. The line segments may be doped using separate implants.

The line structure may be patterned using mask and etch techniques. For example, a photoresist is disposed on a line structure layer. The photoresist may be exposed by an exposure source through a reticle containing the desired pattern of the line structure. After development, the pattern of the reticle is transferred to the photoresist to form an etch mask. An etch is employed to pattern the line structure layer using the etch mask to form the line structure. The etch mask, for example, may be a photoresist mask. The etch, for example, is an anisotropic etch, such as a reactive ion etch (RIE). Other etch processes may also be useful. In one embodiment, the etch forms the line structure with the first and second line segments. Alternatively, the line structure may be a non-continuous line structure having, for example, first and second segments. The first and second segments may be electrically connected by a metal contact.

As shown, the line segments are mirror images of each other. This produces line segments which are about the same length. By providing a meandering design for the line segments, efficient use of the sensor region can be achieved while producing a line structure having the desired resistance. For example, the line structure has a resistance of about 5-50 kΩ. Other resistances may also be useful.

To dope the first and second line segments, separate implants may be used. For example, a first implant using a first implant mask is used to dope the first line segment and a second implant using a second implant mask is used to dope the second line segment. In one embodiment, the line segments are recrystallized αSi line segments. A laser anneal is employed to recrystallize the αSi line segments as well as to activate the dopants.

A line dielectric layer 458 covers the line structure, filling the gaps. The line dielectric layer provides mechanical support for the thermopile membrane. The line dielectric layer may be, for example, such as spin-on-glass (SOG). Other types of line dielectric layers may also be useful. The dielectric layer may have a top surface which is about 100-400 nm above the top of the line structure. Providing a dielectric layer having other thicknesses over the top of the line structure may also be useful.

A contact 466 is provided to electrically couple the first and second segments. The contact, for example, is a metal contact, such as titanium (Ti) or aluminum (Al). Other types of contacts may also be useful. To form the contact, a contact opening is formed in the dielectric layer to expose the line structure at about the junction of the first and second segments. A metal layer is formed on the substrate and patterned, leaving the contact coupling the first and second segments. The metal layer, for example, may be titanium (Ti) or aluminum (Al) formed by sputtering or plating. Other types of metal layers or forming techniques may also be useful.

An absorber layer 457 is formed on the substrate, covering the dielectric layer. The absorber layer may be patterned using etch and mask processes. The patterned absorber layer serves as an absorber above the line structure. In one embodiment, the absorber layer is patterned, covering a central portion of the line structure and contact, leaving the leg portions outside the central portion exposed. The absorber layer, for example, absorbs IR radiation. The absorber layer may be a TiN or NiCr layer. The absorber layer, for example, may be formed by sputtering. Other types of absorber layers may also be useful. In one embodiment, the absorber is configured to absorb most of the IR radiation. For example, the absorber may be configured to absorb greater than 85% of IR radiation having a wavelength of 8-14 μm. Absorbing other wavelengths may also be useful. As shown, the absorber layer is disposed over the contact. The absorber serves as a hot junction of the thermopile. The first end 451 of the first line structure and the second end 452 of the second line structure serve as cold junctions of the thermopile. The leg portions of the line structure uncovered by the absorber provide thermal isolation between the hot and cold junctions.

A protective layer 459 may be provided. The protective layer, for example, covers the MEMS structure. The protective layer protects the MEMS structure from subsequent processes. The protective layer, for example, is a silicon oxide layer formed by CVD. Other types of protective layers may also be useful.

Figure 4C:
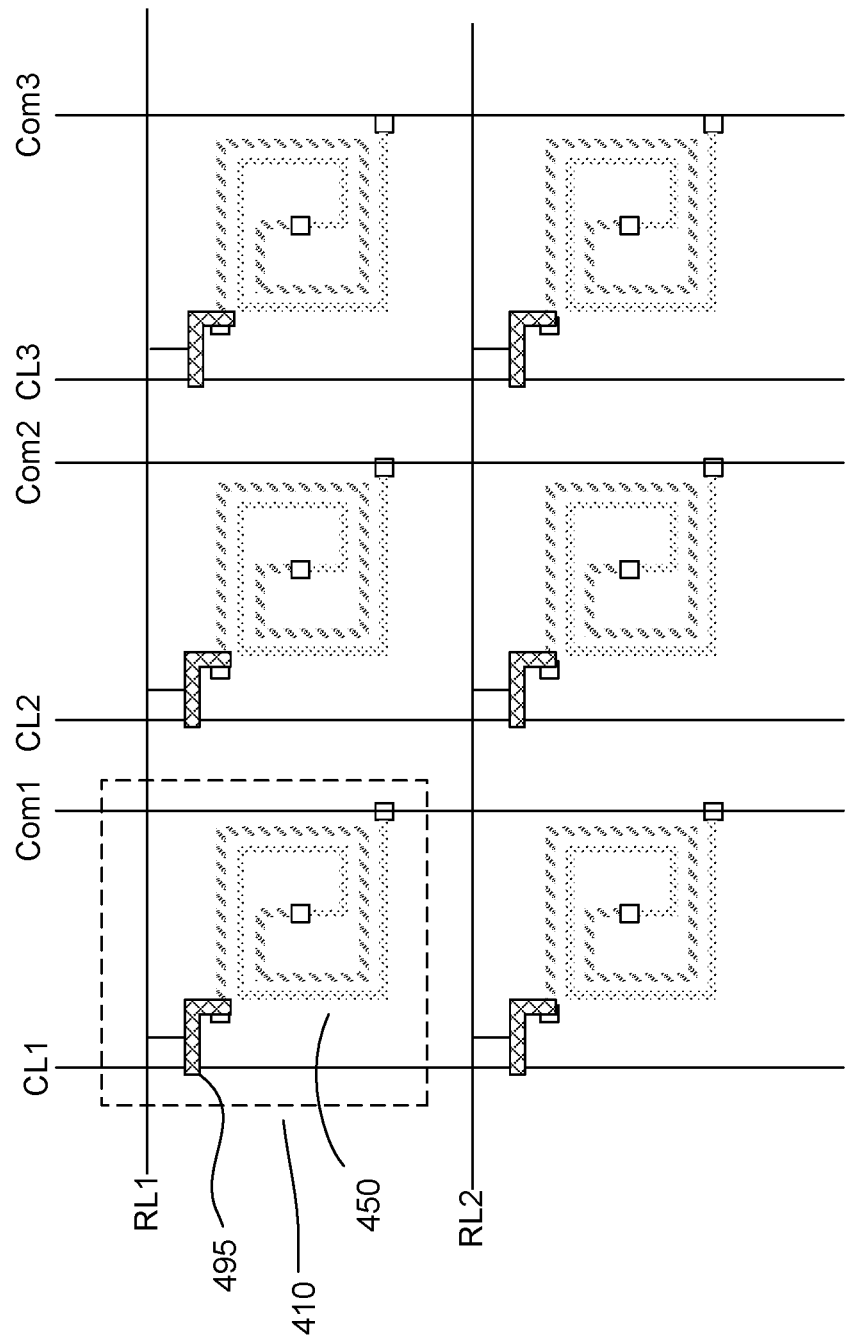
FIG. 4c shows an exemplary layout of a 2×3 sensor array.

FIG. 4c shows a sensor array 404. The sensor array includes a plurality of sensor cells 410. A sensor cell includes a switch coupled to a MEMS structure, such as a line structure or structures as described in FIGS. 4a-4b. Common elements may not be described or described in detail.

The sensor cells are configured to form an array having M rows and N columns. A sensor cell corresponds to a pixel of the sensor array. The sensor cells are coupled in a row direction by row lines ($RL_m$) and in the column direction by column lines ($CL_n$). A sensor cell may correspond to a pixel. Additionally, common lines (Coms) are also used to couple the sensor cells in each column. For example, each column of sensors is coupled to a respective Com (e.g., $Com_1$, $Com_2$ or $Com_3$). As shown, the array includes a 2×3 array (M=2 and N=3). For example, the sensor cells are arranged in 2 rows ($RL_1$ and $RL_2$) and 3 columns ($CL_1$, $CL_2$ and $CL_3$). Other sized arrays may also be useful. For example, the sensor array may be a 32=32 or 80=62 array.

The pixels of the sensor array may include a plurality of sensors arranged in a matrix on the substrate. For example, each pixel may include a sensor region and a CMOS switching or connection region. The sensor regions are disposed in, for example, a sensor array region of the substrate. For example, the sensor array region includes a plurality of sensor regions corresponding to sensor pixels.

In one embodiment, a first terminal of the MEMS structure of a sensor cell is coupled to the switch 495 while a second terminal is coupled to a common line (Com). As shown, each column of sensor cells is coupled to a respective Com (e.g., $Com_1$, $Com_2$, and $Com_3$). A switch may be a transistor having first and second S/D terminals and a gate or control terminal. For example, a first S/D terminal of the switch is coupled to the first terminal of the MEMS structure and the second S/D terminal is coupled to a CL. The RL is coupled to a gate or control terminal of the switch. In one embodiment, the n-type terminal of the sensor cell is coupled to Com and the p-type terminal of the sensor cell is coupled to CL. Other configurations of coupling the sensor cell to CL and Com may also be useful. An RL can be selected to select a row of sensor cells. A CL is activated to select a column of sensor cells. The selected cell is the intersection of the selected RL and selected CL. The interconnections between the CMOS components and sensor pixels may be achieved through the ILD and IMD levels of the BEOL dielectric.

In one embodiment, the sensor array is configured to read out a row of sensor cells or pixels. For example, the pixels of the array are read out one row at a time. In one embodiment, an RL of the array is selected. This selects a row of pixels. CLs are then selected, causing the pixels of the selected RL to be readout. In one embodiment, the array is configured to read out one row of pixels at a time, starting from the first row to the last. The information readout is stored in memory. An image or one frame of the imager will be produced once all pixels are read out or once all rows have been scanned through. For example, information stored in memory read out from the pixels may be reconstructed to form an image.

In the case of the 2×3 array in FIG. 4c, scanning the pixels to form an image may include selecting $RL_1$ (the first row) to select the pixels coupled to $RL_1$. After $RL_1$ is selected, $CL_1$, $CL_2$, and $CL_3$ are selected, causing the pixels coupled to $RL_1$ to be readout. The information of the pixels coupled to $RL_1$ is stored in memory. The next or second row $RL_2$ is selected to select the pixels of $RL_2$. After $RL_2$ is selected, $CL_1$, $CL_2$, and $CL_3$ are selected, causing the pixels coupled to $RL_2$ to be readout. The information of the pixels coupled to $RL_2$ is stored in memory. Since $RL_2$ is the final row of the array, the information of the pixels is reconstructed to form an image or a frame of the imager. Numerous frames may be collected by repeating the sensing, readout and reconstruction process. For example, an image or a frame is time-dependent.

Select logic and output logic components may be employed to select the cell for outputting information contained. The logic components may be CMOS transistors or components in the CMOS region of the device. Other logic components, including memory and reconstruction logic components, may be included to store and reconstruct information to form an image or images. In one embodiment, the memory and reconstruction logic components may be off-chip logic. Providing these logic components as on-chip logic components or a combination of on-chip or off-chip components may also be useful.

FIGS. 5a-5i show simplified cross-sectional views of a process for forming a device. The device may be similar to the devices of FIGS. 2a-2f, but without the caps. As shown, the cross-section views are of a portion of the device, such as that described in FIG. 3. For example, the portion of the device includes a CMOS region and a MEMS device region of the MEMS region. Common elements may not be described or described in detail.

Figure 5A:
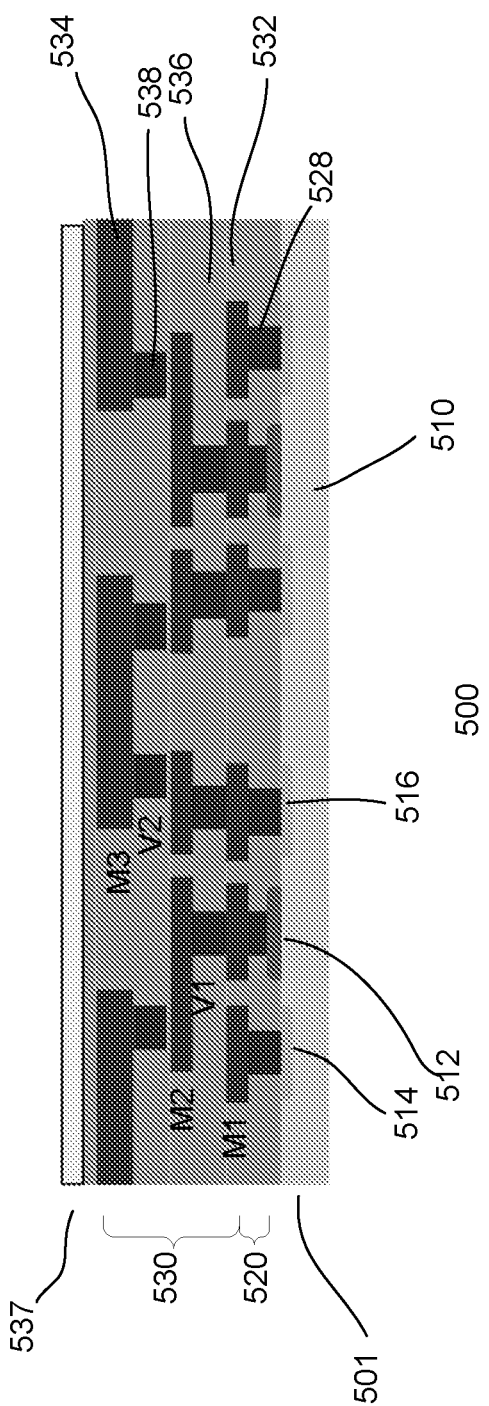
FIGS. 5a-5i show an embodiment of a process for forming a device.

Referring to FIG. 5a, a device 500 is provided. The device, for example, has been processed to form CMOS components in a CMOS region 510 on a substrate 501. The device includes a substrate 501. The substrate, for example, may be a semiconductor substrate, such as a silicon substrate. The substrate, for example, may be a lightly doped p-type silicon substrate. Other types of substrates or wafers may also be useful.

The CMOS components may include pMOS and nMOS transistors. Other CMOS components, such as resistors, capacitors, and diodes may also be included in the CMOS region. The CMOS components are configured to include digital and analog circuitry. As shown, a portion of the CMOS region 510 includes first and second transistors. A transistor includes a gate 512 between S/D regions 514 and 516. Isolation regions, such as FOX or STI, may be provided to isolate the CMOS components. For example, isolation regions are provided to isolate the first and second CMOS device regions with the first and second transistors.

An ILD layer 520 is formed on the substrate. The ILD layer covers the substrate and CMOS region with CMOS components. The ILD layer, for example, is a silicon oxide layer. Other types of dielectric layers or a combination of dielectric layers may also be useful. Metal contact plugs 528, such as tungsten plugs, are provided in the ILD layer and are coupled to contact regions on the substrate and CMOS components. For example, contact plugs are coupled to S/D regions and gates of the CMOS components as well as to well taps for biasing the wells and substrate. Providing contact plugs for other types of contact regions may also be useful.

The contact plugs, for example, may be formed by a damascene process. For example, the ILD layer is formed on the substrate. The surface of the ILD layer may be planarized by, for example, chemical mechanical polish (CMP). The ILD is patterned to form contact holes in the ILD layer. A metal layer, such as tungsten, is deposited on the substrate, filling the contact openings. Excess metal over the ILD layer is removed by, for example, CMP, leaving contact plugs in the contact openings. Other techniques for forming the contact plugs may also be useful.

A back-end-of-line (BEOL) dielectric 530 is provided on the substrate over the ILD layer 520. For example, the BEOL dielectric covers the CMOS region. The BEOL dielectric may include multiple intermetal dielectric (IMD) levels formed by BEOL dielectric layers. For example, the BEOL dielectric may include y IMD levels, where y is from 2-8. Other numbers of IMD levels, including 1, may also be useful, depending on the design and CMOS process. The ILD layer and BEOL dielectric may be referred to as a BE dielectric.

An IMD level may include a via dielectric level 536 and a metal dielectric level 532. A via dielectric level and a metal dielectric level of an IMD level may be formed from one or more dielectric layers, depending on the design and process approach. The via dielectric level may be disposed above a metal dielectric level. For example, a metal level (Mx) may be disposed below a first via level (Vx). For example, as shown, the BEOL includes 3 IMD levels (x=1 to 3). The metal dielectric level includes metal lines 534 and the via dielectric level includes via contacts 538. The first metal level dielectric M1 is disposed over the ILD layer. Other configurations of BEOL dielectric layers may also be useful.

As shown, the BEOL dielectric includes 3 IMD levels. For example, the first IMD level includes M1 and V1, the second IMD level includes M2 and V2 and the third or top IMD level includes M3. In one embodiment, M1 may be formed by a single damascene technique. For example, an M1 dielectric may be formed over the IMD level and patterned to form trenches corresponding to M1 metal lines. A metal layer, such as copper or copper alloy, may be formed on the substrate, filling the trenches and covering the M1 dielectric. Other types of metals or alloys, such as aluminum, may also be used. Excess metal is removed by CMP, leaving M1 metal lines in the M1 dielectric. Forming M1 using an RIE process may also be useful. In an RIE process, a metal layer is formed on the ILD layer and patterned to form M1 metal lines. A dielectric layer is formed on the substrate, filling the gaps between the metal lines. A CMP may be performed to remove excess dielectric layer. In some cases, the dielectric may be a self-planarizing layer, such as spin-on glass.

As for M2 and V1, they may be formed by a dual damascene process. For example, a dielectric layer may be formed on the substrate over M1. The dielectric layer is patterned to form trenches of M2 and via openings of V1, creating dual damascene structures. The dual damascene structures may be formed using a via first or via last dual damascene process. In addition, multiple dielectric layers may be employed to form the dual damascene structures. For example, an etch stop layer may be employed between M1 and V1. A metal layer, such as copper or copper alloy, may be formed on the substrate, filling the dual damascene structures. Other types of metals or alloys, such as aluminum, may also be used. Excess metal is removed by CMP, leaving M2 metal lines over V1 via contacts. Forming M2 and V1 using other processes, such as a combination of single damascene for V1 and RIE for M2, may also be useful.

M3 and V2 may be formed similarly to M2 and V1. In other embodiments, V2 may be formed using a damascene process and M3 is formed using a damascene or RIE process. M3, for example, may be formed of aluminum. Other types of metals, such as copper or copper alloy, may also be used.

As for M3, it may serve as a pad level. For example, M3 metal lines may serve as pad metal lines. A passivation layer 537 may be formed over the pad lines. The passivation layer, for example, may include one or more dielectric layers. In one embodiment, the passivation layer includes a silicon nitride layer over a silicon oxide layer, forming a $SiO_2$/SiN passivation stack. Other types of passivation layers or stacks may also be useful. Pad openings may be provided in the passivation layer to expose the contact pads of the pad lines. Other approaches for forming the pad level may also be useful.

Figure 5B:
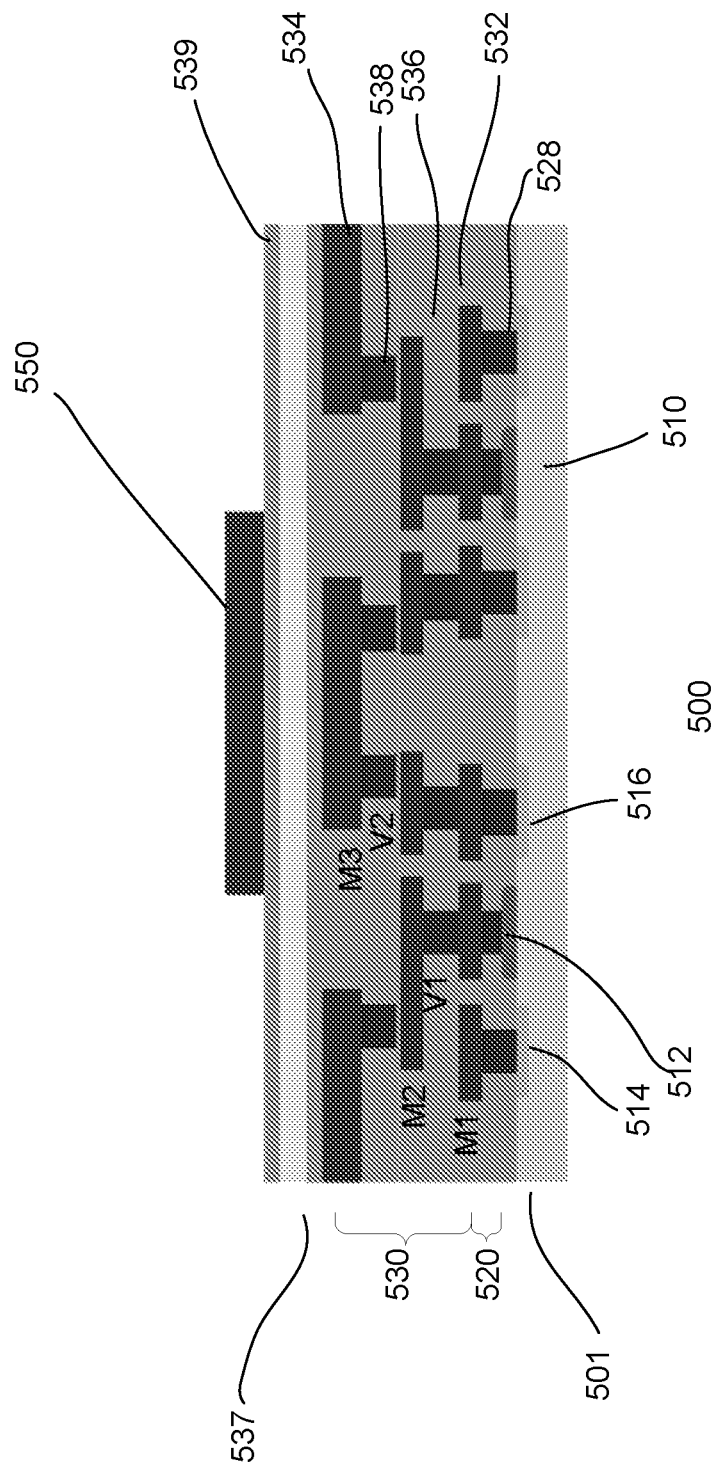

In FIG. 5b, the process commences forming the MEMS level. In one embodiment, the process commences by forming a base or buffer layer 539 on the passivation layer. The base layer is a dielectric base layer, such as silicon oxide. Other types of base layers may also be useful. The base layer may be formed by chemical vapor deposition. In one embodiment, the base layer may be formed by a low-temperature process. For example, the buffer layer may be formed by PECVD. Other low-temperature processes, such as LPCVD or APCVD may also be useful. The base layer should be sufficiently thick to protect the passivation layer below from the etchant, such as $XeF_2$, used in a subsequent release process to form the lower sensor cavity.

An IR reflector 550 is formed on the base layer. The IR reflector may be a metal IR reflector. For example, the metal IR reflector may be formed of titanium (Ti), tungsten (W) or aluminum. Other types of IR reflectors may also be useful. To form the IR reflector, a metal layer of the IR reflector is formed on the substrate. For example, the metal layer is formed on the base layer. The metal layer may be formed by, for example, sputtering. Other techniques for forming the metal layer may also be useful. The metal layer is patterned to form the IR reflector. Patterning the metal layer may include mask and etch processes. For example, a resist mask is formed over the metal layer and developed to expose portions of the metal layer to be removed by a etch process, such as a reactive ion etch (RIE). Other techniques for patterning the metal layer may also be useful. The patterning process, for example, forms individual IR reflectors for the sensors of the sensor array.

Figure 5C:
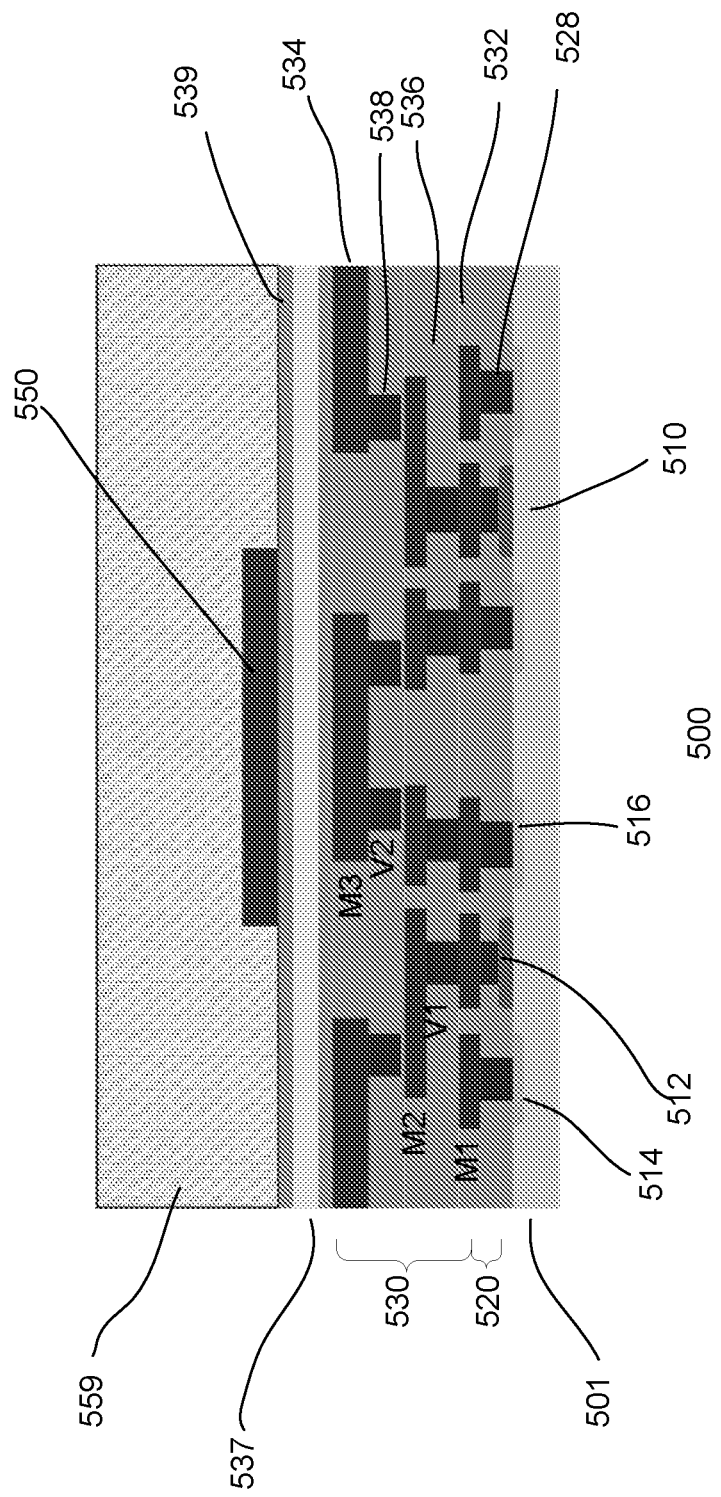

In one embodiment, as shown in FIG. 5c, a sacrificial layer 559 is formed on the substrate. The sacrificial layer, for example, is a low temperature sacrificial layer. In one embodiment, the sacrificial layer is an amorphous silicon (αSi) amorphous layer. The αSi sacrificial layer is formed using a low temperature process. For example, the sacrificial layer is formed using a low temperature process, such as PECVD at a temperature of less than 400° C. Other types of low-temperature sacrificial layers and/or low-temperature processes for forming the sacrificial layer may also be useful.

In one embodiment, the thickness of the sacrificial layer is used to define the height of the lower sensor cavity of the sensor array. For example, the thickness of the sacrificial layer should be equal to about the height of the lower sensor cavity. For example, in the case of a 1.2 um high lower sensor cavity, the sacrificial layer should be about 1.2 um high.

Figure 5D:
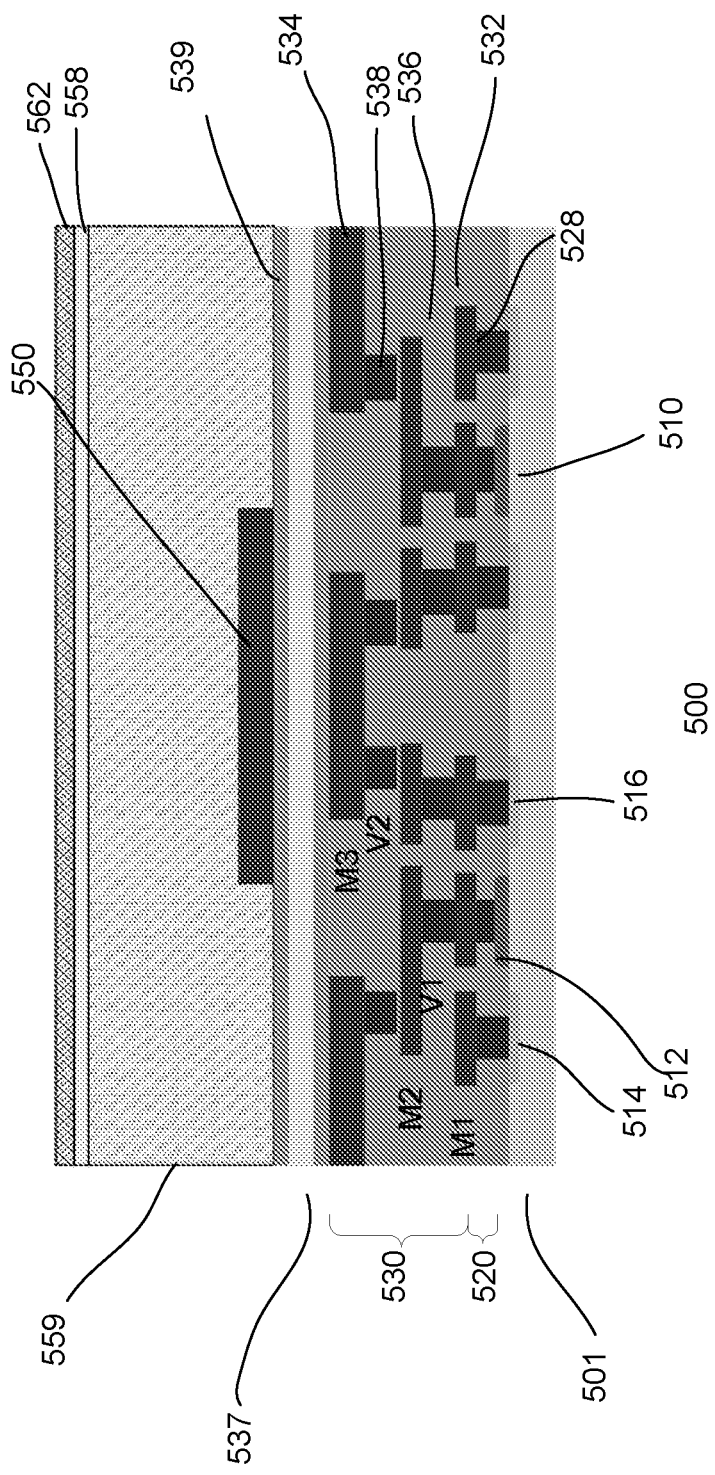

Referring to FIG. 5d, a MEMS dielectric layer 558 is formed on the substrate. For example, the MEMS dielectric layer is formed on the sacrificial layer. In one embodiment, the MEMS dielectric layer serves as a membrane layer for the sensors of the MEMS region. The MEMS dielectric layer, in one embodiment, is a low-temperature oxide. For example, the lower temperature oxide may be formed by PECVD. Other low-temperature processes may also be used to form the MEMS dielectric layer.

A MEMS structure layer 562 is formed on the substrate. For example, the MEMS structure layer is formed on the MEMS dielectric layer. In one embodiment, the MEMS structure layer is an αSi layer. The MEMS structure layer is formed by a low-temperature process. For example, the MEMS structure layer may be formed by PECVD.

Figure 5E:
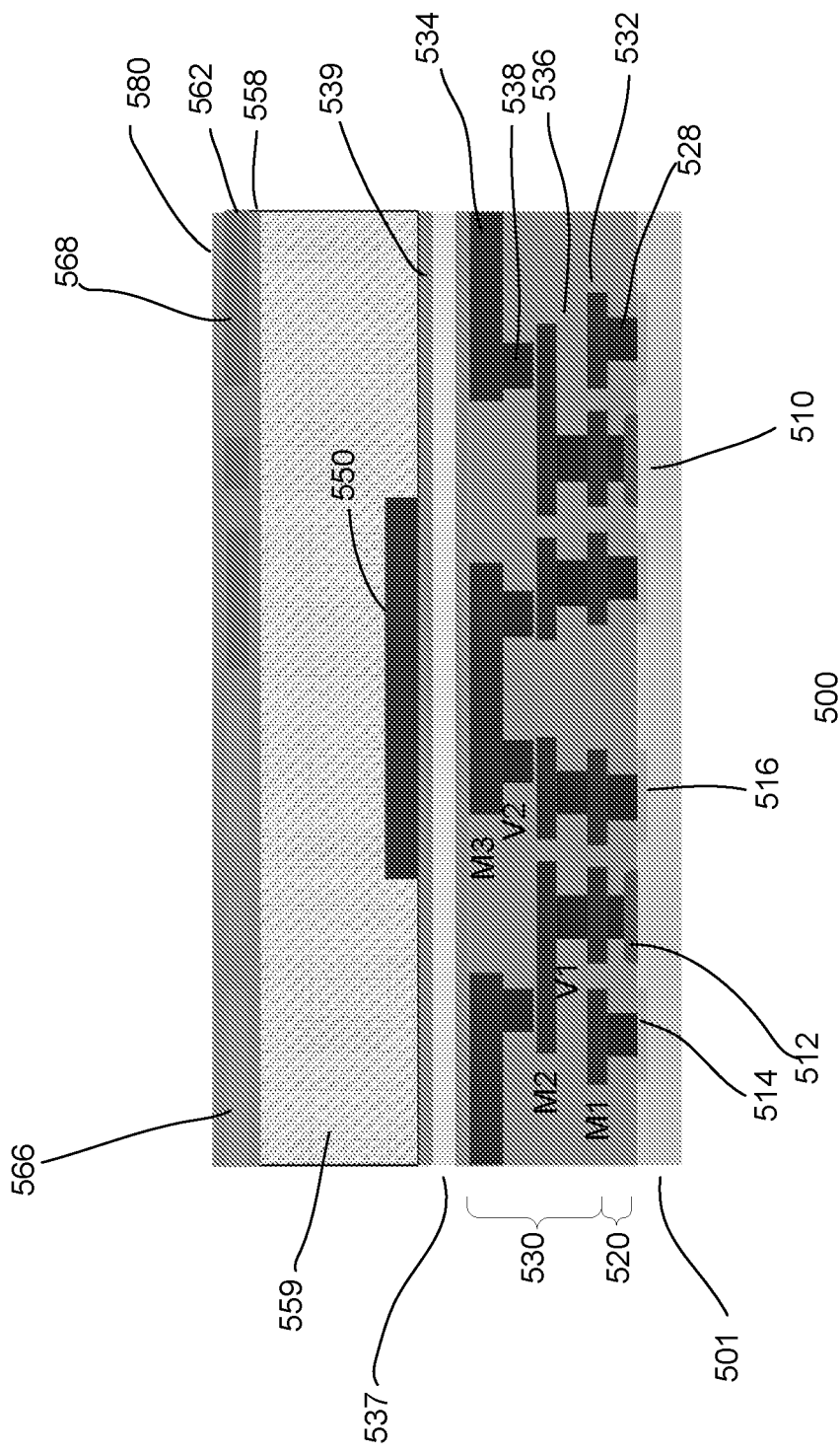

As shown in FIG. 5e, the process commences forming the MEMS structure. In one embodiment, the process commences forming a thermopile structure for MEMS device regions. For example, a thermopile structure is formed for each MEMS device region of the sensor array. In one embodiment, the process includes patterning the MEMS structure layer 562 to form thermopile line structures. For example, a thermopile line structure includes first and second line segments 566 and 568.

The line segments are doped with first and second polarity type dopants. For example, the first line segment is doped with first polarity type dopants, such as n-type and the second line segment is doped with second polarity type dopants, such as p-type dopants. The doping of the first and second line segments may be achieved by ion implantation. For example, a first ion implantation is performed using a first implant mask to dope the first line segment and a second ion implantation is performed using a second implant mask to dope the second line segment. Doping the line segments may alternatively be achieved by in-situ doping when forming the MEMS structure layer. For example, the MEMS structure layer is doped as it is deposited.

The doped line segments are processed to crystallize the MEMS structure layer. For example, the line segments are processed to crystallize the αSi line segments In one embodiment, recrystallizing the line segments is achieved using pulsed laser annealing. The pulsed laser annealing may be performed using an Excimer laser. Other types of pulsed laser annealing may also be useful. The laser annealing also activates the dopants of the doped line segments. Alternatively, employing other techniques for recrystallizing the line segments may also be useful.

A dielectric layer 580 is formed over the thermopile structure. The dielectric layer, for example, may be an intermediate dielectric layer which is disposed over the MEMS dielectric layer and covers the thermopile structure. In one embodiment, the intermediate dielectric layer is a low-temperature oxide layer. For example, the oxide layer is formed by a low-temperature process, similar to the MEMS dielectric layer.

Figure 5F:
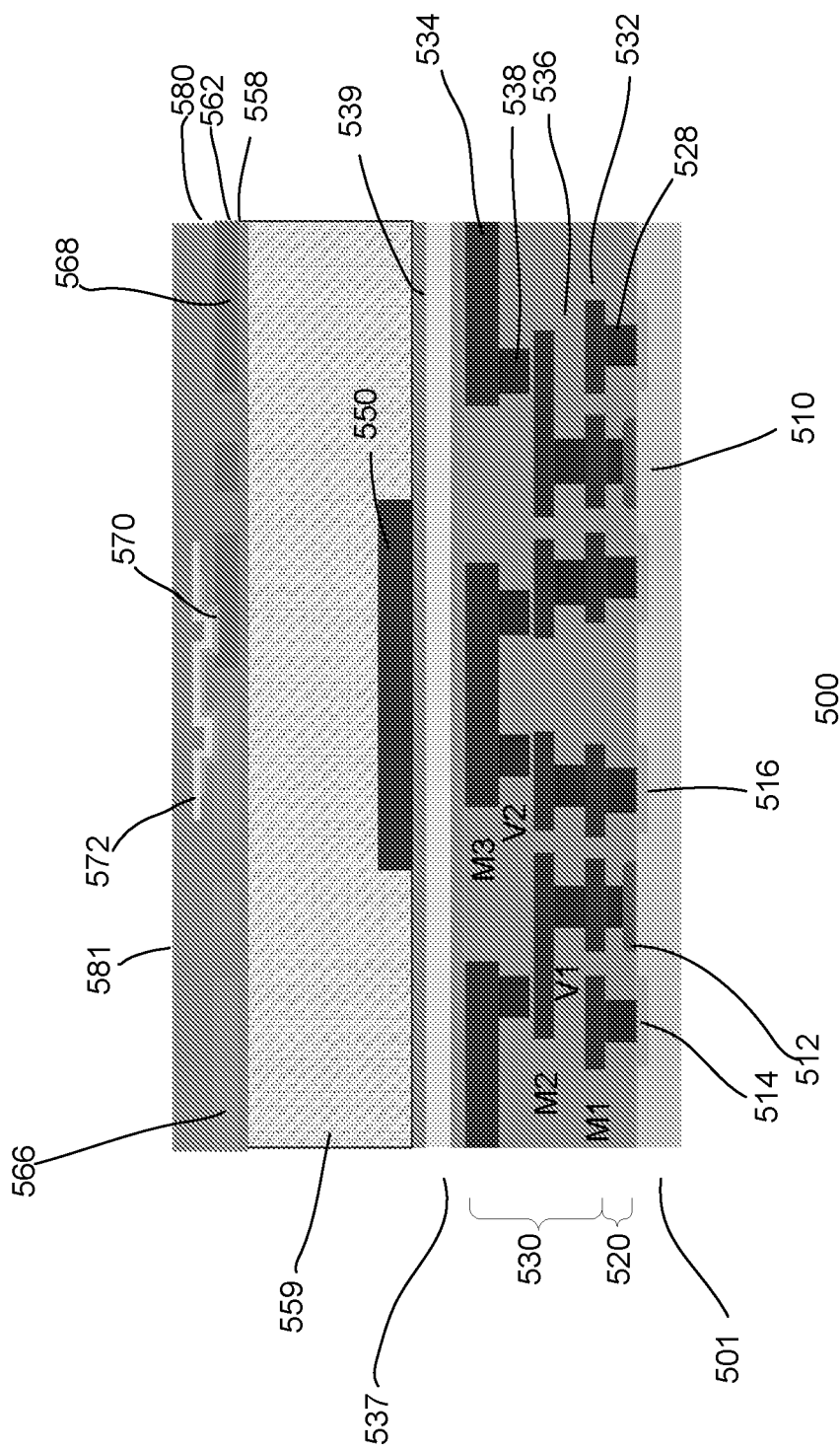

Referring to FIG. 5f, a contact 570 is formed on the intermediate layer which couples the first and second line segments. For example, a thermopile link bridge or contact is formed to couple the first and second line segments. In one embodiment, forming the contact includes forming contact openings in the intermediate dielectric layer. For example, a first contact opening is formed to expose an adjacent end of the first line segment adjacent to the second line segment and a second contact opening is formed to expose an adjacent end of the second line segment adjacent to the first line segment. A metal layer, such as Ti, is formed on the intermediate dielectric layer. Other types of metal layers may also be useful. The metal layer, for example, lines a top of the intermediate dielectric layer and the contact openings. The metal layer is patterned to form the link bridge which couples the first and second line segments.

An absorber 572 is formed over the line structure. For example, the absorber is formed on the line structure and covers the contact 570. In one embodiment, the absorber is formed to cover a central portion of the line structure, including the contact. The absorber layer, for example, is configured to absorb incident IR radiation. The absorber may be a titanium nitride (TiN) absorber. Other types of absorbers may also be useful. For example, the absorber layer may be a nickel-chromium (NiCr) layer or a doped amorphous silicon layer. In one embodiment, the absorber is configured to absorb most of the incident IR radiation. For example, the absorber may be configured to absorb greater than 85% of incident IR radiation having a wavelength of 8-14 μm. Providing any other configurations may also be useful. In other embodiments, the absorber is configured to absorb incident radiation having a wavelength of 2-5 μm. For example, another harmonic of the interferometric absorber is used. In one embodiment, the absorber is configured to absorb >50% of incident radiation having a wavelength of 2-5 μm.

To form the absorber, an absorber layer is formed on the substrate, covering the line structure, the contact, and the intermediate dielectric layer. The absorber layer may be formed by sputtering or a low-temperature process, depending on the material of the absorber layer. For example, metallic absorber layers may be formed by sputtering while the amorphous silicon layer may be formed by a low-temperature process. The amorphous silicon layer may be in-situ doped or doped by ion implantation. After depositing the absorber layer, it is patterned to form the absorber.

A top dielectric layer 581 is formed on the substrate, covering the line structure and absorber. The top dielectric layer serves as a protective layer over the line structure. In one embodiment, the top dielectric layer is a low-temperature oxide. For example, the oxide is formed by a low-temperature process. Other types of dielectric layers may also be useful.

Figure 5G:
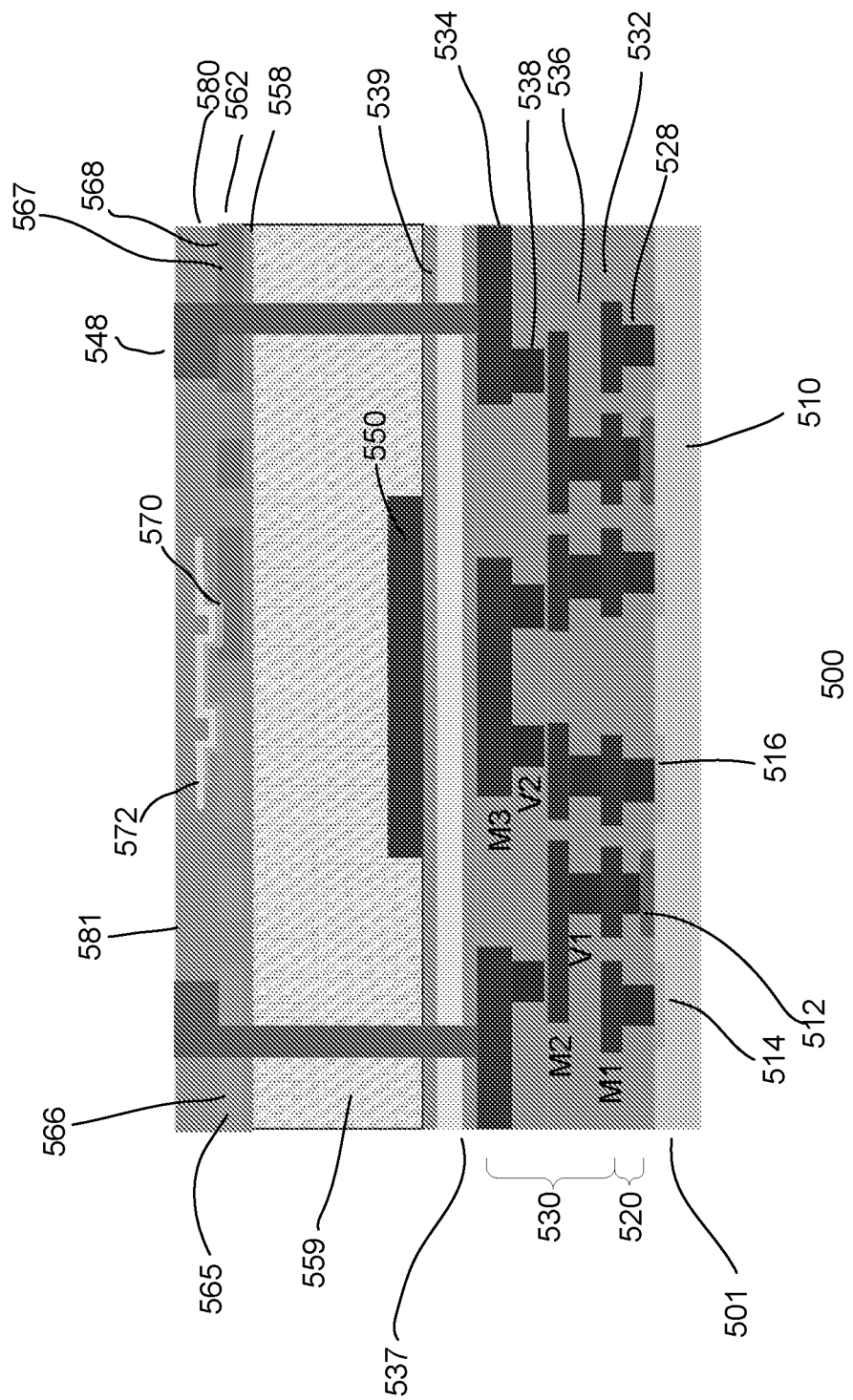

In FIG. 5g, MC contacts 548 are formed. The MC contacts provide electrical connections of the MEMS sensors to the CMOS components in the CMOS region. The MC contacts, for example, are coupled to the terminals of the sensors and a top metal or pad level, which connects to the CMOS components in the CMOS region. In one embodiment, MC contacts are provided for each sensor of the array. For example, first and second MC contacts are provided for first and second terminals 565 and 567 of each sensor. In one embodiment, the MC contacts may be coupled to CMOS transistors in the CMOS region. For example, one terminal is coupled to a gate of a CMOS transistor and the other terminal is coupled to a common line. Other configurations of the MC contacts may also be useful.

To form the MC contacts, MC contact vias may be formed. For example, MC contact vias are formed by mask and etch processes, such as RIE using a resist mask. The contact vias extend from the protective dielectric layer to the top metal level M3 of the BEOL dielectric 530. As shown, the contact vias include wider openings in the protective and intermediate dielectric layers to expose top surfaces of the first and second terminals of the line structure. For example, a 2-step etch is employed, one to form the wider upper portion and the other to form the narrower lower portion. In one embodiment, the first etch is used to form the upper portion and the second etch is used to form the lower portion. A metal layer is formed on the substrate, filling the contact via openings as well as covering the exposed terminals and the surface of the protective dielectric layer. The metal layer, for example, may be copper or copper alloy. Other types of metal layers may also be useful. The metal layer may be formed by plating or sputtering. Other techniques for forming the metal layer may also be useful. Excess metal is removed by CMP, leaving a coplanar top surface with the metal with the protective layer. Other techniques for removing the excess metal, such as RIE, may also be useful.

Figure 5H:
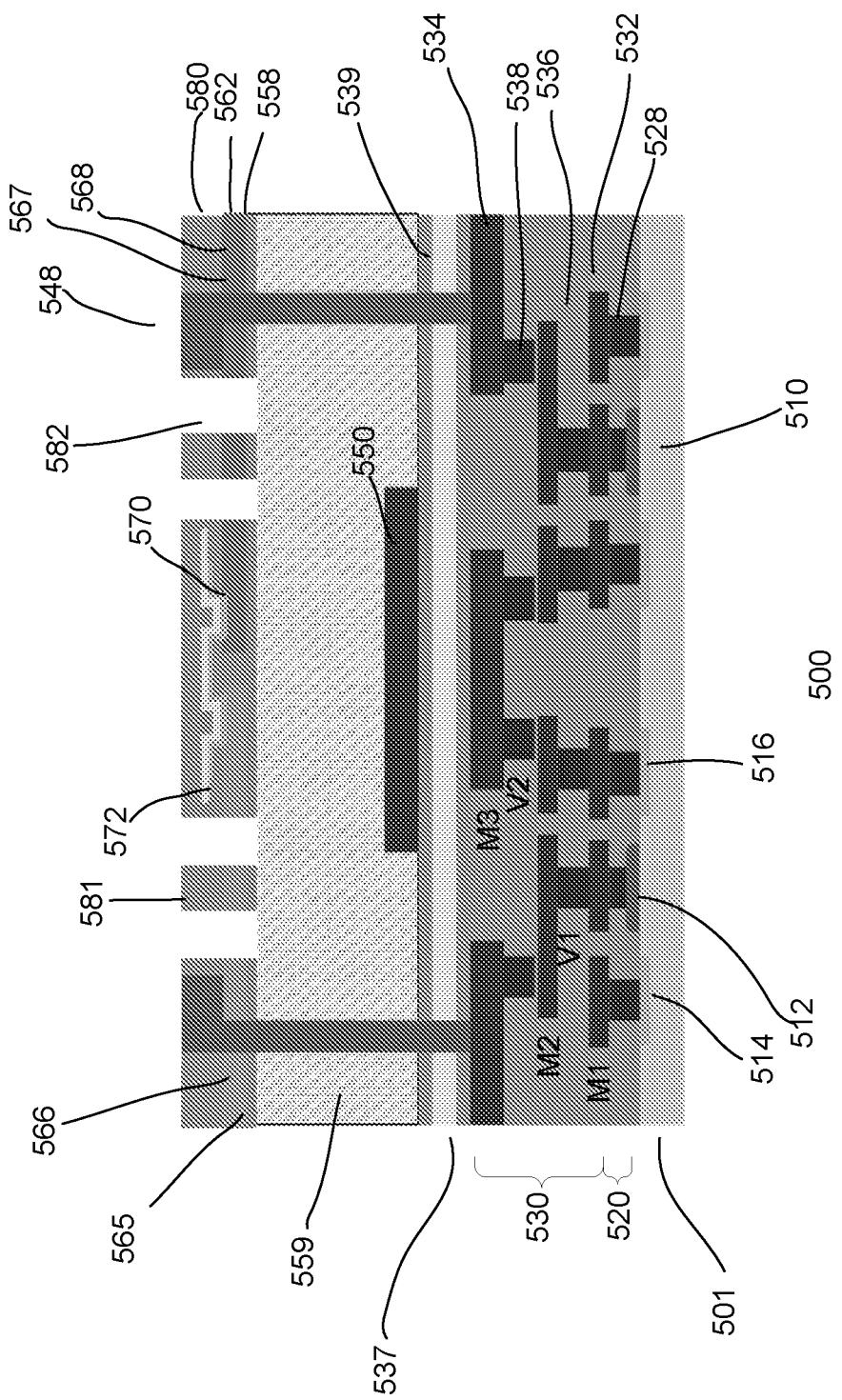

Referring to FIG. 5h, release openings 582 are formed in the dielectric stack, which includes the MEMS dielectric layer 558 and layers above. For example, release openings are formed through the protective layer 581, the intermediate dielectric layer 580 and the MEMS dielectric layer 558. The release openings, for example, exposes the sacrificial layer 559 filling the cavity or cavities. Mask and etch processes may be employed to form the release openings. For example, an RIE may be employed using an etch mask to form the release openings. Other techniques for forming the release openings may also be useful.

Figure 5I:
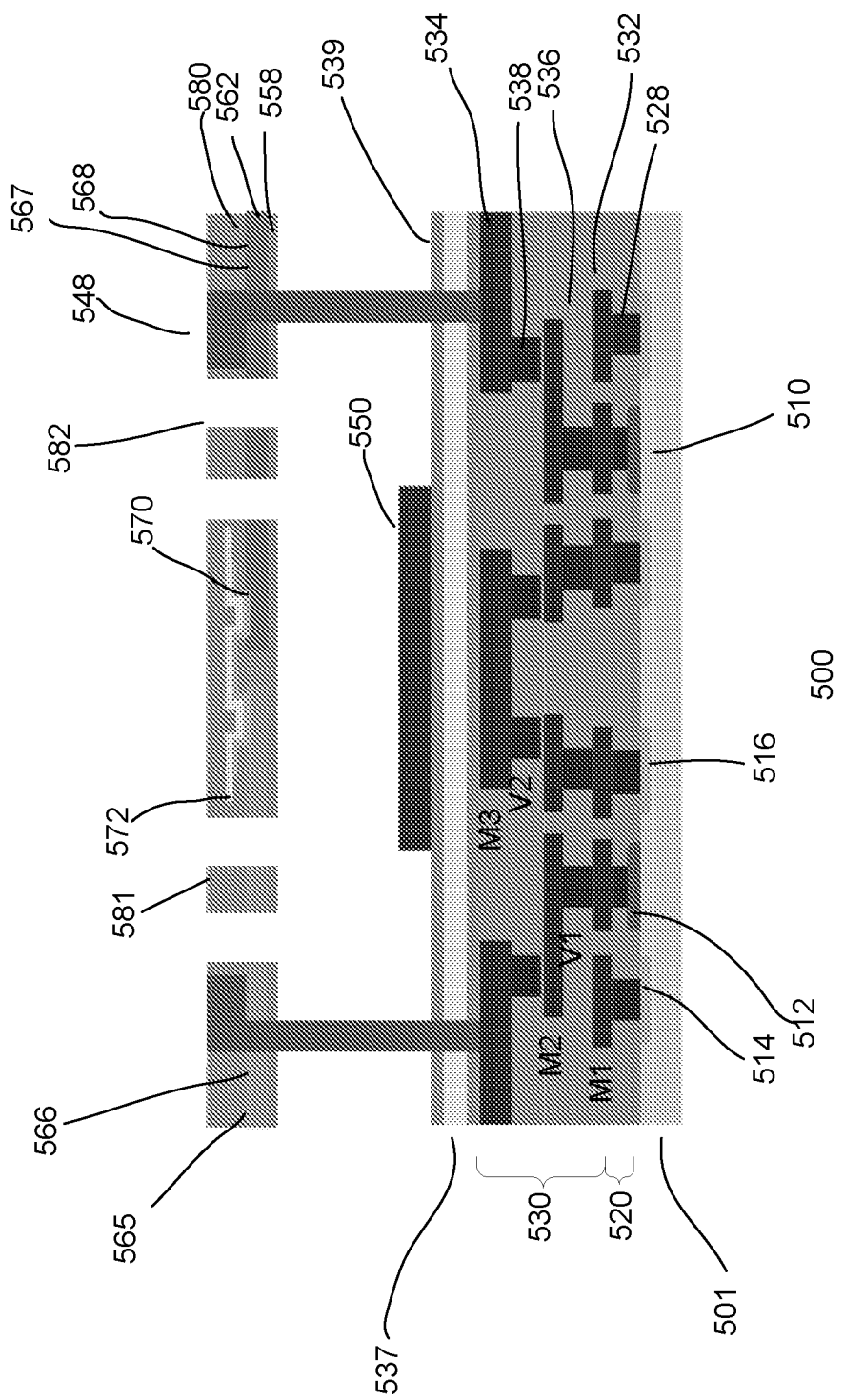

In FIG. 5i, the sacrificial layer is removed, forming the lower sensor cavity. In one embodiment, the sacrificial layer is removed by, for example, a release etch. The release etch, for example, may be a dry MEMS release etch. The dry MEMS release etch may employ a release etching, such as $XeF_2$. Other types of release processes may also be useful. The MC contacts provide mechanical support for the MEMS dielectric layer with the sensors after the release etch.

The process continues to form a cap over the MEMS region. For example, the cap forms a cap cavity encapsulating the MEMS sensors. In one embodiment, the cap forms a common cap cavity for the sensors of the MEMS region. The cap, for example, may be bonded to the device using bond rings on the cap and on the BEOL dielectric outside of the MEMS level. Bonding, for example, may be achieved using thermal compression bonding. Other bonding techniques may also be useful. In one embodiment, wafer-level vacuum packaging is performed to bond a cap wafer onto a device wafer. Prior to forming the cap to encapsulate the device, pad openings may be formed to expose pads of the pad level. The pads, for example, are located outside of the cap bonding region.

Figure 6A:
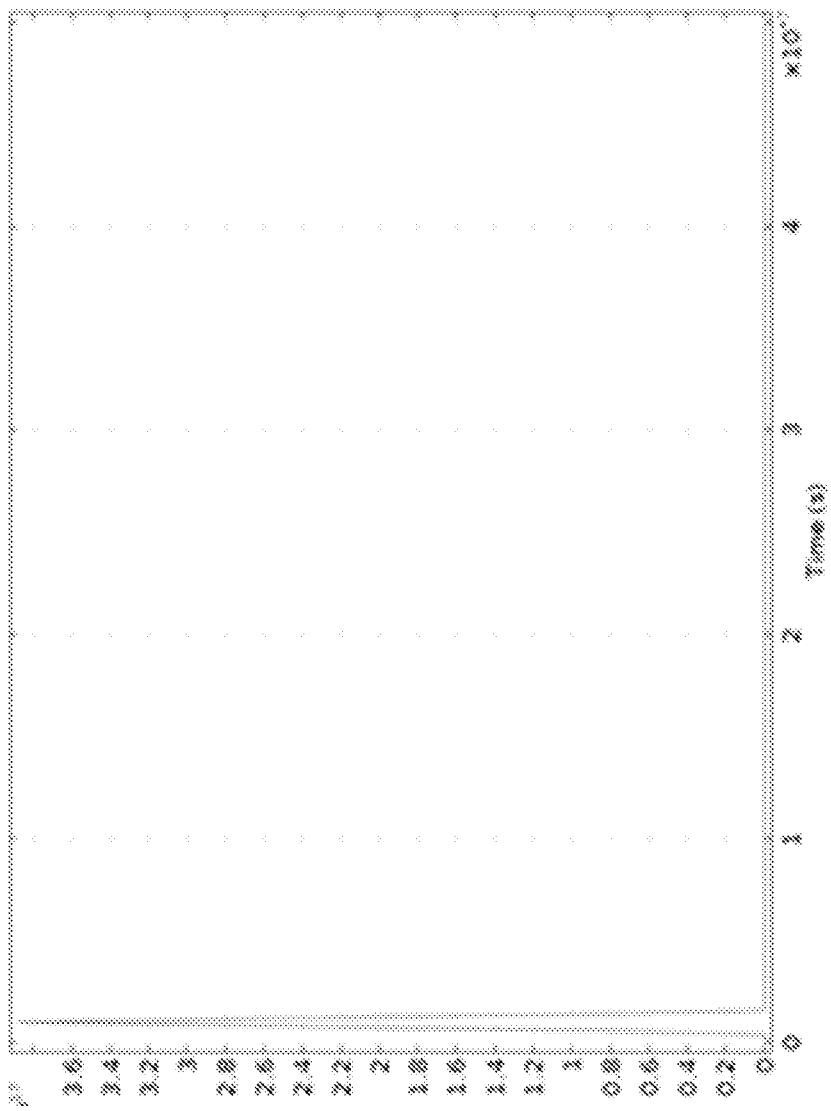
FIG. 6a plots the energy of a laser heat source over time.
Figure 6B:
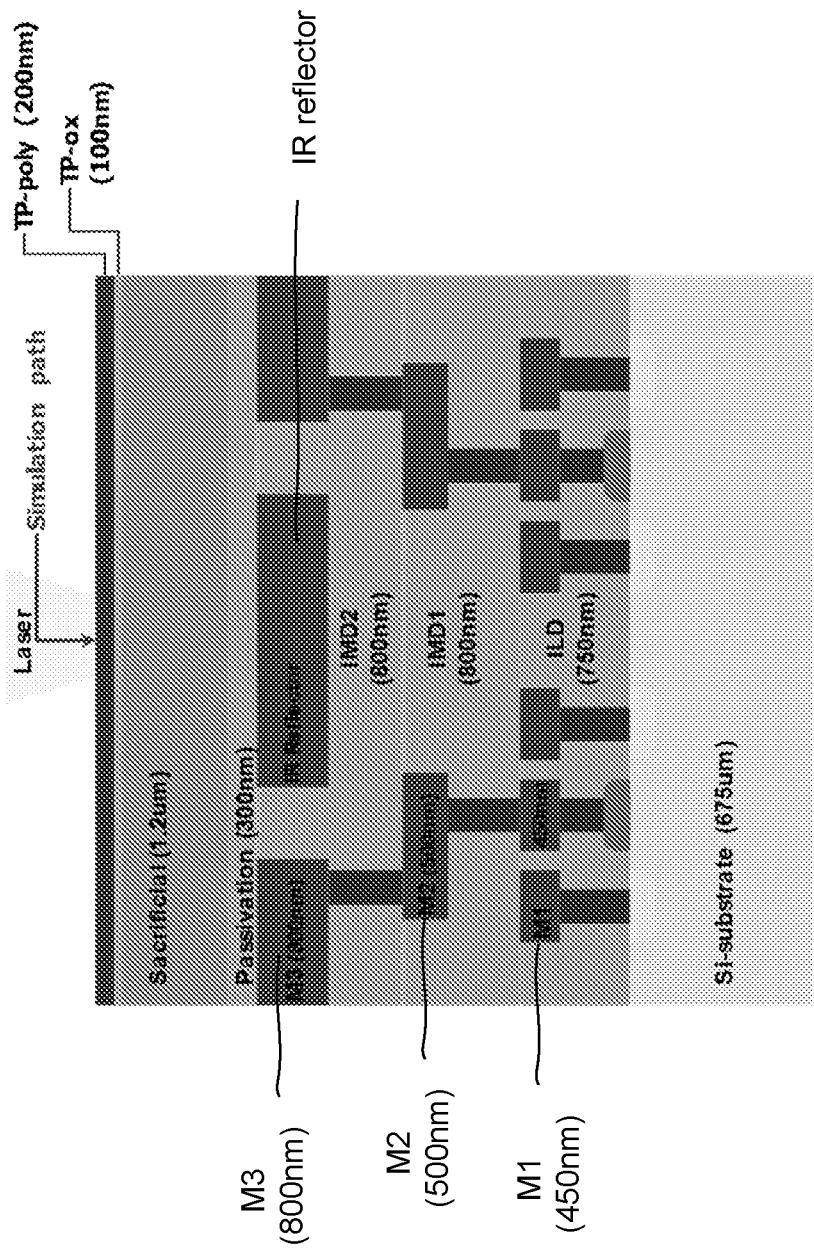
Figure 6C:
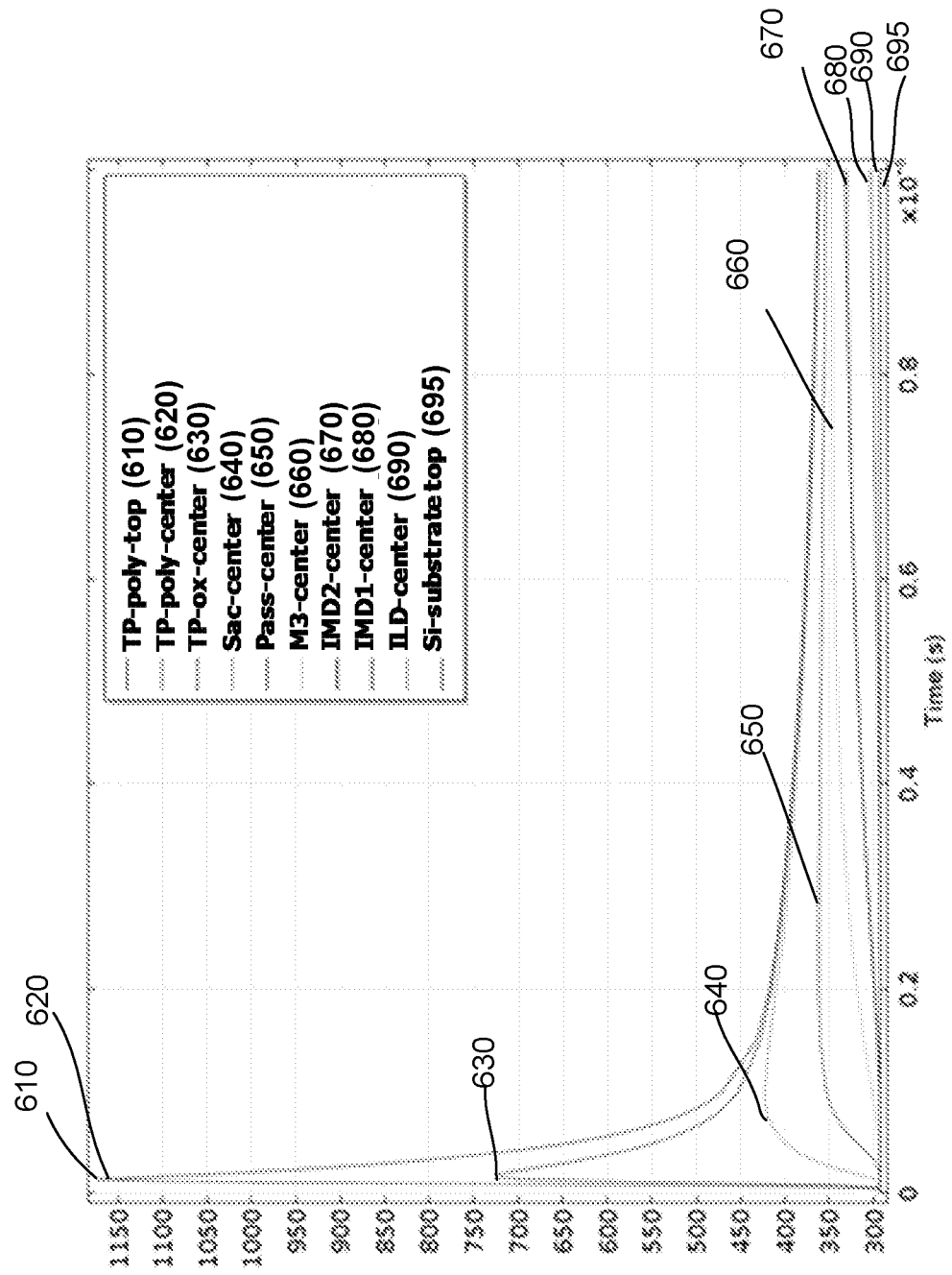
FIG. 6c simulates the temperature of a structure heated by a laser heat source at different depths over time.

FIG. 6a shows a graph 600 of the laser power over time. FIG. 6b shows a structure 601 simulated with laser annealing using the laser source of FIG. 6a. The structure, for example, is similar to that used in forming the CMOS device with monolithic integration of MEMS sensors. The thicknesses of the various layers are shown. FIG. 6c shows a graph 602 of temperatures at different parts of the structure of FIG. 6b. As shown, the laser annealing is effective in recrystallizing the amorphous silicon layer used to form the line structures of the sensors as well as activating the dopants of the line structures while the peak temperature of structures at and below the top metal level (M3) remains at and below 350° C., as well as below the post CMOS compatible temperature. Employing other techniques for recrystallizing the line segments while maintaining the structures at and below the top metal level (M3) within post CMOS compatible temperature may also be useful.

As described, the present device integrates MEMS components with CMOS components monolithically. In one embodiment, monolithic integration of MEMS components after fabrication of CMOS components is facilitated by the use of low-temperature processes to deposit MEMS structure layers, such as αSi, doping the layers, recrystallizing the layers, and activating the dopants using pulsed laser annealing, such as with Excimer lasers. Laser annealing enables recrystallizing the MEMS structure layers and activating the dopants without heating the BEOL dielectric and ILD layer above a threshold temperature. For example, the metal layers in the ILD and BEOL dielectric can remain at about 350° C., which is well within the thermal budget of post-CMOS processes.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. A method for forming a device comprising:
providing a substrate prepared with a complementary metal oxide semiconductor (CMOS) region with CMOS components
forming a BE dielectric over the CMOS components, wherein the BE dielectric comprises multiple interconnect and via levels with interconnects and via contacts for interconnecting the CMOS components;
forming a MEMS level on the BE dielectric, wherein the MEMS level comprises a MEMS region with a MEMS component, the MEMS component includes recrystallized polysilicon MEMS structures, wherein the MEMS level occupies a portion of the BE dielectric;
forming a substrate sealing ring on the BE dielectric surrounding the MEMS level;
providing a cap having a cap inner surface and a cap outer surface, wherein the cap inner surface includes a cap sealing ring; and
bonding the cap sealing ring of the cap to the substrate sealing ring on the BE dielectric to hermetically seal the MEMS level.

2. The method of claim 1 wherein forming the MEMS level comprises:
forming a buffer layer on the BE dielectric;
forming a sacrificial layer on the buffer layer;
forming a MEMS dielectric layer on the sacrificial layer;
forming a MEMS structure layer on the MEMS dielectric layer, wherein the MEMS structure layer comprises amorphous silicon;
patterning the MEMS structure layer to form the MEMS component; and
annealing the MEMS component by laser annealing to recrystallize the MEMS component to form the recrystallized polysilicon MEMS structures.

3. The method of claim 1 comprises:
patterning a MEMS structure layer comprising amorphous silicon to form MEMS structures;
doping the MEMS structures; and
laser annealing the MEMS structures, wherein laser annealing recrystallizes the MEMS structures and activates dopants to form the recrystallized polysilicon MEMS structures.

4. The method of claim 3 wherein doping the MEMS structures comprises implanting ions into the MEMS structures.

5. The method of claim 3 comprises:
forming MC contacts to connect terminals of the MEMS structures to the interconnections in the BE dielectric, wherein the MC contacts extend through layers below the MEMS structures, including a sacrificial layer;
forming release openings in a MEMS dielectric layer to expose the sacrificial layer; and
removing the sacrificial layer to form a MEMS cavity, wherein the MC contacts mechanically support the MEMS structures over the MEMS cavity.

6. The method of claim 5 wherein the MEMS structures in the MEMS region comprise a thermoelectric-based infrared (IR) sensor array with IR sensors.

7. A device comprising:
a substrate prepared with
a complementary metal oxide semiconductor (CMOS) region with CMOS components, and
a BE dielectric over the CMOS components, wherein the BE dielectric comprises interconnect and via levels with interconnects and via contacts for interconnecting the CMOS components;
a MEMS level over the BE dielectric, wherein the MEMS level comprises a MEMS region with a MEMS component, the MEMS component includes recrystallized polysilicon structures, wherein the MEMS level occupies a portion over the BE dielectric;
a substrate sealing ring on the BE dielectric surrounding the MEMS level;
a cap having a cap inner surface and a cap outer surface, wherein the cap inner surface includes a cap sealing ring; and
wherein the cap sealing ring of the cap is bonded to the substrate bonding ring on the BE dielectric to hermetically seal the MEMS level.

8. The device of claim 7 comprises a MEMS cavity separating the MEMS component and the BE dielectric.

9. The device of claim 8 comprises:
MC contacts for connecting terminals of MEMS component to the interconnections in the BE dielectric, the MC contacts extend below the MEMS component in the MEMS level; and
wherein the MC contacts mechanically support the MEMS component over the MEMS cavity.

10. The device of claim 9 wherein the MEMS component in the MEMS region comprise a thermoelectric-based infrared (IR) sensor array with IR sensors.

11. The method of claim 1 wherein the MEMS structures in the MEMS region comprise a thermoelectric-based infrared (IR) sensor array with IR sensors.

12. The device of claim 7 wherein the MEMS structures in the MEMS region comprise a thermoelectric-based infrared (IR) sensor array with IR sensors.

13. A method for forming a device comprising:
providing a substrate prepared with a complementary metal oxide semiconductor (CMOS) region with CMOS components;
forming a BE dielectric over the CMOS components, wherein the BE dielectric comprises multiple levels of interconnect and via levels with interconnects and via contacts for interconnecting the CMOS components;
forming a sacrificial layer over the BE dielectric;
forming a MEMS level on the sacrificial layer, wherein the MEMS level comprises an amorphous silicon MEMS structure layer;
patterning the MEMS level to form a MEMS structure in a MEMS region;
recrystallizing the amorphous silicon of the MEMS structure to form a recrystallized polysilicon MEMS structure;
removing the sacrificial layer below the MEMS structure to form a MEMS cavity between the MEMS structure and BE dielectric;
forming a substrate sealing ring on the BE dielectric surrounding the MEMS structure;
providing a cap having a cap inner surface and a cap outer surface, wherein the cap inner surface includes a cap sealing ring; and
bonding the cap sealing ring of the cap to the substrate sealing ring on the BE dielectric to hermetically seal the MEMS structure in the MEMS region.

14. The method of claim 13 wherein forming the MEMS level comprises:
forming a buffer layer on the BE dielectric below the sacrificial layer;
forming a MEMS dielectric layer on the sacrificial layer; and forming the MEMS structure layer on the MEMS dielectric layer.

15. The method of claim 13 comprises:
doping the MEMS structure with dopants; and
recrystallizing the amorphous silicon by laser annealing, wherein the laser annealing activates the dopants.

16. The method of claim 15 wherein doping the MEMS structure comprises implanting ions into the MEMS structure.

17. The method of claim 13 wherein the MEMS structure in the MEMS region comprise a thermoelectric-based infrared (IR) sensor array.

18. The method of claim 13 comprises:
forming MC contacts to connect terminals of the MEMS structure to the interconnections in the BE dielectric, wherein the MC contacts extend through layers below the MEMS structure, including the sacrificial layer; and
wherein the MC contacts mechanically support the MEMS structure over the MEMS cavity.

19. The method of claim 18 wherein the MEMS structure in the MEMS region comprise a thermoelectric-based infrared (IR) sensor.

20. The method of claim 13 wherein the MEMS structure in the MEMS region comprise a thermoelectric-based infrared (IR) sensor.

* * * * *